United States Patent
Segawa et al.

(10) Patent No.: US 6,342,818 B1
(45) Date of Patent: *Jan. 29, 2002

(54) PLL HAVING SWITCHING CIRCUIT FOR MAINTAINING LOCK DURING LOSS OF INPUT SIGNAL

(75) Inventors: Yuji Segawa, Hachioji; Kunihiko Gotoh, Tama, both of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/312,489

(22) Filed: May 17, 1999

(30) Foreign Application Priority Data

Dec. 4, 1998 (JP) .............................. 10-345970

(51) Int. Cl.[7] .......................... H03B 7/06; H03B 7/093; H03B 7/14
(52) U.S. Cl. .............................. 331/14; 331/17; 331/18; 331/25
(58) Field of Search ............................ 331/14, 17, 18, 331/25

(56) References Cited

U.S. PATENT DOCUMENTS

| | | | |
|---|---|---|---|
| 4,061,979 A | * 12/1977 | Walker et al. | 331/17 |
| 4,360,781 A | * 11/1982 | Sochor | 331/17 |
| 4,931,748 A | * 6/1990 | McDermott et al. | 331/17 |
| 5,081,705 A | * 1/1992 | Swanke | 331/18 |
| 5,164,684 A | * 11/1992 | Tanaka | 331/14 |
| 5,410,572 A | 4/1995 | Yoshida | 375/376 |
| 5,455,840 A | * 10/1995 | Nakauchi et al. | 375/371 |
| 5,457,428 A | * 10/1995 | Alder et al. | 331/1 A |
| 5,572,167 A | * 11/1996 | Alder et al. | 331/1 A |
| 5,648,964 A | * 7/1997 | Inagaki et al. | 370/228 |

OTHER PUBLICATIONS

Patent Abstracts of Japan, 61–184924, Aug. 18, 1986.

Patent Abstracts of Japan, 9–200050, Jul. 31, 1997.

Daniel W. Lewis, "A Fault–Tolerant Clock Using Standby Sparing", The Ninth Annual International Symposium On Fault–Tolerant Computing, Digest of Papers, IEEE, 1979, pp. 33–39, XP–00100 2915.

"Glitchless Oscillator Switch For High Reliability", IBM Technical Disclosure Bulletin, IBM Corp. New York, vol. 34, No. 2, Jul. 1, 1991, pp. 55–58, XP–000210563.

"Integratable Loss–Of–Oscillator Circuit For Use With Standby Sparing In Conjunction With Phase–Locked Loop Buffering Of System Oscillator", IBM Technical Disclosure Bulletin, IBM Corp. New York, vol. 35, No. 4A, Sep. 1, 1992, pp. 406–409, XP–000314814.

D. Neperud, "Control Network To Prevent Railing Of PLL With Loss Of Reference Frequency", Motorola Technical Developments, Motorola Inc., Schaumburg, Illinois, vol. 28, Aug. 1, 1996, pp. 1–2, XP–000638400.

* cited by examiner

*Primary Examiner*—David Mis
(74) *Attorney, Agent, or Firm*—Arent Fox Kintner Plotkin & Kahn, PLLC

(57) ABSTRACT

A cut-off state of a carrier signal or a carrier signal outside an effective range of a frequency is detected by a carrier detector, and a signal switching circuit inputs a clock 2 from an external device into a phase comparator in place of the carrier signal, with which a locked state is maintained in a PLL comprising the phase comparator, a charge pump, a loop filter, a voltage control oscillator, and a 1/N divider, so that a high-speed locking operation is realized to another appropriate carrier signal.

13 Claims, 15 Drawing Sheets

FIG.5

|   | A1 | A0 | B1 | B0 | OG | OE | OS |
|---|----|----|----|----|----|----|----|
| 0 | 0  | 0  | 0  | 0  | 0  | 1  | 0  |
| 1 | 0  | 1  | 0  | 0  | 1  | 0  | 0  |
| 2 | 1  | 0  | 0  | 0  | 1  | 0  | 0  |
| 3 | 1  | 1  | 0  | 0  | 1  | 0  | 0  |
| 0 | 0  | 0  | 0  | 1  | 0  | 0  | 1  |
| 1 | 0  | 1  | 0  | 1  | 0  | 1  | 0  |
| 2 | 1  | 0  | 0  | 1  | 1  | 0  | 0  |
| 3 | 1  | 1  | 0  | 1  | 1  | 0  | 0  |
| 0 | 0  | 0  | 1  | 0  | 0  | 0  | 1  |
| 1 | 0  | 1  | 1  | 0  | 0  | 0  | 1  |
| 2 | 1  | 0  | 1  | 0  | 0  | 1  | 0  |
| 3 | 1  | 1  | 1  | 0  | 1  | 0  | 0  |
| 0 | 0  | 0  | 1  | 1  | 0  | 0  | 1  |
| 1 | 0  | 1  | 1  | 1  | 0  | 0  | 1  |
| 2 | 1  | 0  | 1  | 1  | 0  | 0  | 1  |
| 3 | 1  | 1  | 1  | 1  | 0  | 1  | 0  |

PLL HAVING SWITCHING CIRCUIT FOR MAINTAINING LOCK DURING LOSS OF INPUT SIGNAL

FIELD OF THE INVENTION

The present invention relates to a semiconductor integrated circuit for receiving a specified signal such as a carrier signal and a feedback signal outputted from a voltage control oscillator for outputting a synchronous signal based on the specified signal, comparing the phase of the specified signal to the phase of the feedback signal and outputting a comparison signal indicating a result of comparison to the voltage control oscillator, and more specifically to a semiconductor integrated circuit for forming a PLL (Phase-Locked Loop) to perform a locking operation.

BACKGROUND OF THE INVENTION

FIG. 1 is a block diagram showing schematic configuration of a PLL circuit based on the conventional technology. In FIG. 1, the conventional type of PLL circuit comprises a phase comparator 102, a charge pump 103, a loop filter 104, a voltage control oscillator 105, and a 1/N divider 106.

Herein, especially a PLL circuit for receiving a carrier signal indicating an FM input signal as an input signal and obtaining a synchronous signal to this carrier signal is described. In FIG. 1, the phase comparator 102 compares a timing of the rising point of the received carrier signal to that of an oscillation signal received from the voltage control oscillator 105 through the 1/N divider 106 (an oscillation signal received from the voltage control oscillator 105 through the 1/N divider 106 is referred to as an internal oscillation signal hereinafter), and when an rising of the internal oscillation signal is delayed as compared to the carrier signal, namely when the frequency of the internal oscillation signal is lower than the frequency of the carrier signal inputs a signal UP as a low level into the gate of a P channel type of MOS transistor 112 in the charge pump 103 during that period.

On the other hand, when the rising of the internal oscillation signal is leading the carrier signal, namely when a frequency of the internal oscillation signal is higher than the frequency of the carrier signal inputs a signal DOWN as a high level into the gate of a N channel type of MOS transistor 113 in the charge pump 103 during that period.

The charge pump 103 is configured so that a current source 111, the P channel type of MOS transistor 112, the N channel type of MOS transistor 113, and a current source 114 are serially connected to each other between a power unit and the ground, and a node (node N) of the MOS transistor 112 and MOS transistor 113 is connected to the voltage control oscillator 105 through the loop filter 104.

When a signal UP indicating a low level is inputted into the gate of the MOS transistor 112 the MOS transistor 112 is turned ON and a positive charge is supplied from the current source 111 to the node N. Namely, a positive charge is supplied to the loop filter 104 that is provided in the next stage. The amplitude of this positive charge is obtained by integrating the current values for the current source 111 over a period of time for which the signal UP keeps on indicating the low level.

On the other hand, when a signal DOWN indicating a high level is inputted into the gate of the MOS transistor 113, the MOS transistor 113 is turned on and a negative charge is supplied from the current source 114 to the node N. Namely, a negative charge is supplied to the loop filter 104 provided in the next stage. The amplitude of this negative charge is obtained by integrating the current values for the current source 114 over a period of time for which the signal DOWN keeps on indicating the high level.

The loop filter 104 is configured so that a resistor 115 and a capacitor 116 are serially connected to each other between a node N and the ground and it accumulates the charge supplied from the charge pump 103 in the capacitor 116 through the resistor 115 and generates a control voltage for controlling the voltage control oscillator 105 provided in the next stage.

The voltage control oscillator 105 is an oscillator for outputting a signal with a frequency decided according to a control voltage, and can obtain this oscillation signal as a synchronous signal. Further, this oscillation signal is inputted into the 1/N divider 106. The 1/N divider 106 subjects the oscillation signal from the voltage control oscillator 105 to 1/N-division so that the frequency of the oscillation signal from the voltage control oscillator 105 coincides with the frequency of the carrier signal, and outputs the subjected signal as an internal oscillation signal as described above. This internal oscillation signal is inputted again into the phase comparator 102, which effects formation of a negative feedback loop for receiving an output signal as an input signal again.

Thus, the PLL circuit increases the frequency of the internal oscillation signal by feeding a positive voltage corresponding to the phase difference to the voltage control oscillator 105 as a control signal when the phase of the internal oscillation signal is delayed with respect to the carrier signal. Namely, a higher frequency can make the phase lead. When the phase of the internal oscillation signal leads the carrier signal the frequency of the internal oscillation signal is lowered by feeding a negative voltage corresponding to the phase difference to the voltage control oscillator 105 as a control signal. Namely, a lower frequency can make the phase delayed.

By the action of negative feedback described above, the frequency of the internal oscillation signal coincides with the carrier signal in its frequency as well as phase thereof, therefore, a synchronous signal that accurately indicates the frequency of the carrier signal can be outputted. The state where the frequency of this carrier signal coincides with that of the internal oscillation signal is termed as a locked state, and the period of time required to reach this locked state is termed as lock-up time.

In the PLL circuit shown in FIG. 1, operations of the charge pump 103 as well as the loop filter 104 can equivalently be realized by a digital circuit and there has been distributed a digital PLL obtained by changing the configuration including those components described above, phase comparator 102, voltage control oscillator 105, and 1/N divider 106 to a digital format.

The digital PLL, especially a PLL-IC obtained by forming the digital PLL to an IC is applied in a digital system such as an FSK modem demodulator for demodulating an A/D converted carrier signal and a frequency synthesizer for a transceiver.

However, in the conventional type of PLL circuit, a locked stage is unlocked when a carrier signal is not inputted because of its being shut off due to an external factor or the like or when a carrier signal outside an effective range of a frequency is inputted, and when an appropriate carrier signal is again inputted a sequential operation for reaching the locked state again (described a locking operation hereinafter) is required to be performed. As described above, a long time is required for the lock-up operation, therefore, a synchronous signal can not speedily be obtained.

SUMMARY OF THE INVENTION

The present invention was made to solve the problems described above, and it is an object of the present invention to perform a high-speed locking operation and realize a high-speed and stable feedback loop operation when an appropriate carrier signal is inputted again after entry of a carrier signal is cut off or a carrier signal outside an effective range of a frequency is inputted.

In order to solve the above problems and achieve the object, in the present invention, a semiconductor integrated circuit for comparing a phase of a specified signal (such as a carrier signal) to that of an internal oscillation signal (a feedback signal) outputted from a voltage control oscillator by a phase comparing unit, and receiving a synchronous signal in synchronism to a carrier signal by inputting a result of the comparison in this phase comparing unit, namely a comparison signal indicating a phase difference between the specified signal and internal oscillation signal to be supplied back to the voltage control oscillator; the semiconductor integrated circuit comprises an oscillating state detector for detecting an oscillating state of the specified signal; and a signal switch for switching the specified signal or the comparison signal outputted from the phase comparing unit to a signal for maintaining the internal oscillation signal having been outputted up to the time just before switching from the voltage control oscillator according to the oscillating state detected by the oscillating state detector, namely to a control signal inputted into the voltage control oscillator to make the oscillator keep on outputting the internal oscillation signal.

With the above invention, an oscillating state of the specified signal is detected by the carrier detector, and the specified signal or the comparison signal is switched to a signal for maintaining oscillation and output of an internal oscillation signal outputted from the voltage control oscillator according to the detected oscillating state, so that, for example, when the specified signal is not detected or when a signal outside a specified range of a frequency is inputted, the internal oscillation signal is not cut off by inputting a signal For making the voltage control oscillator keep on outputting an internal oscillation signal having been outputted up to the time just before switching from the voltage control oscillator therein, therefore, when a normal specified signal is inputted again, a locking operation can be speeded up as compared to the case where a feedback loop operation is started from the state in which the internal oscillation signal is not outputted from the voltage control oscillator, namely from the state in which there is no feedback signal.

According to one feature of the present invention, a semiconductor integrated circuit for comparing a phase of a specified signal to that of an internal oscillation signal outputted from a voltage control oscillator by a phase comparing unit, and receiving a synchronous signal in synchronism to a specified signal by inputting a result of the comparison in this phase comparing unit, namely a comparison signal indicating a phase difference between the specified signal and internal oscillation signal to be supplied back to the voltage control oscillator; the semiconductor integrated circuit comprises an oscillating state detector for detecting an oscillating state of the specified signal; and a signal switch for switching entry to the phase comparing unit from the specified signal to a previously-prepared signal (clock 2) with a specified frequency according to the oscillating state detected by the oscillating state detector.

With the above invention, an oscillating state of the specified signal is detected by the oscillating state detector, and the specified signal is switched to the clock 2 to be inputted into the phase comparing unit according to the detected oscillating state, so that, for example, even when a specified signal is not detected or when a signal outside a specified range of a frequency is inputted, the locked state is not unlocked, therefore, a lock-up time required when an effective signal is detected again can be reduced, which allows a high-speed and stable feedback loop operation to be realized.

According to one feature of the present invention, a semiconductor integrated circuit for comparing a phase of a specified signal to that of an internal oscillation signal outputted from a voltage control oscillator by a phase comparing unit, and receiving a synchronous signal in synchronism to a specified signal by inputting a result of the comparison in this phase comparing unit, namely a comparison signal indicating a phase difference between the specified signal and internal oscillation signal to be supplied back to the voltage control oscillator; the semiconductor integrated circuit comprises an oscillating state detector for detecting an oscillating state of the specified signal; and a signal switch for switching the comparison signal outputted from the phase comparing unit to a signal generated depending on a constant voltage source or a constant current source according to the oscillating state detected by the oscillating state detector.

With the above invention, an oscillating state of the specified signal is detected and the comparison signal is switched to a signal generated depending on the constant voltage source for supplying a specified voltage or the constant current source for supplying a specified charge according to the detected oscillating state, so that, for example, even when a specified signal is not detected or when a signal outside a specified range of a frequency is inputted, the locked state is not unlocked, therefore, a lock-up time required when an effective signal is detected again can be reduced, which allows a high-speed and stable feedback loop operation to be realized.

According to one feature of the present invention, a semiconductor integrated circuit for comparing a phase of a specified signal to that of an internal oscillation signal outputted from a voltage control oscillator by a phase comparing unit, and receiving a synchronous signal in synchronism to a specified signal by inputting a result of the comparison in this phase comparing unit, namely a comparison signal indicating a phase difference between the specified signal and internal oscillation signal to be supplied back to the voltage control oscillator; the semiconductor integrated circuit comprises a holding unit for holding therein the comparison signal outputted from the phase comparing unit; an oscillating state detector for detecting an oscillating state of the specified signal; and a signal switch for switching the comparison signal to a voltage held in the holding unit according to the oscillating state detected by the oscillating state detector.

With the above invention, the comparison signal outputted from the phase comparing unit is held in the holding unit, and the signal switch switches entry to a loop filter or the voltage control oscillator from the comparison signal to a voltage held in the holding unit according to the oscillating state of the specified signal detected by the oscillating state detector, so that, for example, even when a specified signal is not detected or when a signal outside a specified range of a frequency is inputted, the locked state is not unlocked, and a feedback signal according to the comparison signal in the previous locked state is inputted, therefore, a lock-up time required when an effective signal is detected again can further be reduced, which allows a high-speed and stable feedback loop operation to be realized.

According to one feature of the present invention, a semiconductor integrated circuit in addition has a oscillating state detector which checks presence of the specified signal and/or a frequency of the specified signal, and outputs, when it is determined that the specified signal is not being inputted or that a frequency of the specified signal is outside a prespecified range, a detection signal indicating that an oscillating state of the specified signal does not satisfy prespecified requirements; and a signal switch which switches the specified signal or the comparison signal outputted from the phase comparing unit to a signal for maintaining an internal oscillation signal according to this detection signal.

According to one feature of the present invention, a semiconductor integrated circuit in addition has a oscillating state detector comprising a counter for counting a pulse number of the specified signal during a specified period of time according to an external clock (clock 1) or a number of external clocks during a specified period of time according to the specified signal, and a condition comparing unit for comparing a pulse number or a pulse number of the clock 1 counted by the counter to a comparison object value indicating the prespecified range for a frequency of the specified signal and outputting a condition comparison signal, and also the specified detector outputs the detection signal according to the condition comparison signal.

According to one feature of the present invention, a semiconductor integrated circuit in addition has a voltage control oscillator internally provided therein as one of the components to form a PLL (Phase-Locked Loop).

With the above invention, the voltage control oscillator is internally provided therein, and a function as the PLL circuit for controlling the voltage control oscillator is effected by a control voltage generated according to the comparison signal outputted from the phase comparing unit, so that an external circuit for functioning as the PLL circuit is reduced, which allows an operation of the PLL by one chip and minimization of the PLL circuit to be achieved.

Other objects and features of this invention will become apparent from the following description with reference to the accompanying drawings.

BRIEF DESCRIPTION OF THE DRAWINGS

FIG. 5 is a truth table showing a relation among (A1, A0), (B1, B0), and each output signal in the terminals OS, OE, and OG in the semiconductor integrated circuit according to Embodiment 1.

DESCRIPTION OF THE PREFERRED EMBODIMENTS

Detailed description for preferred embodiments of the operational amplifier according to the present invention follows. The preferred embodiments of the semiconductor integrated circuit according to the present invention will be made with reference to the related drawings. It should be noted that, the present invention is not limited by these embodiments.

Figure 1:
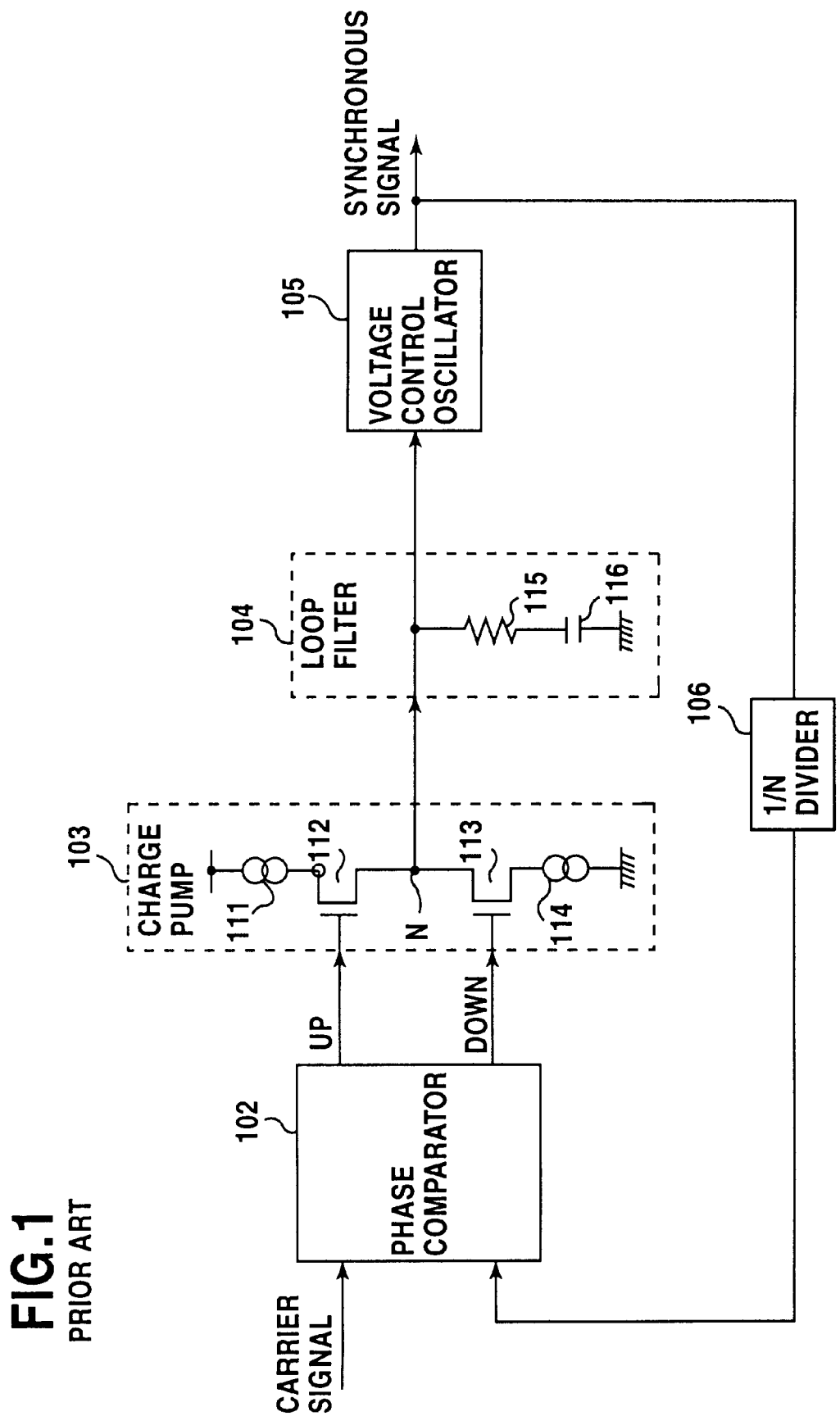
FIG. 1 is a block diagram showing schematic configuration of the PLL circuit based on the conventional technology.
Figure 2:
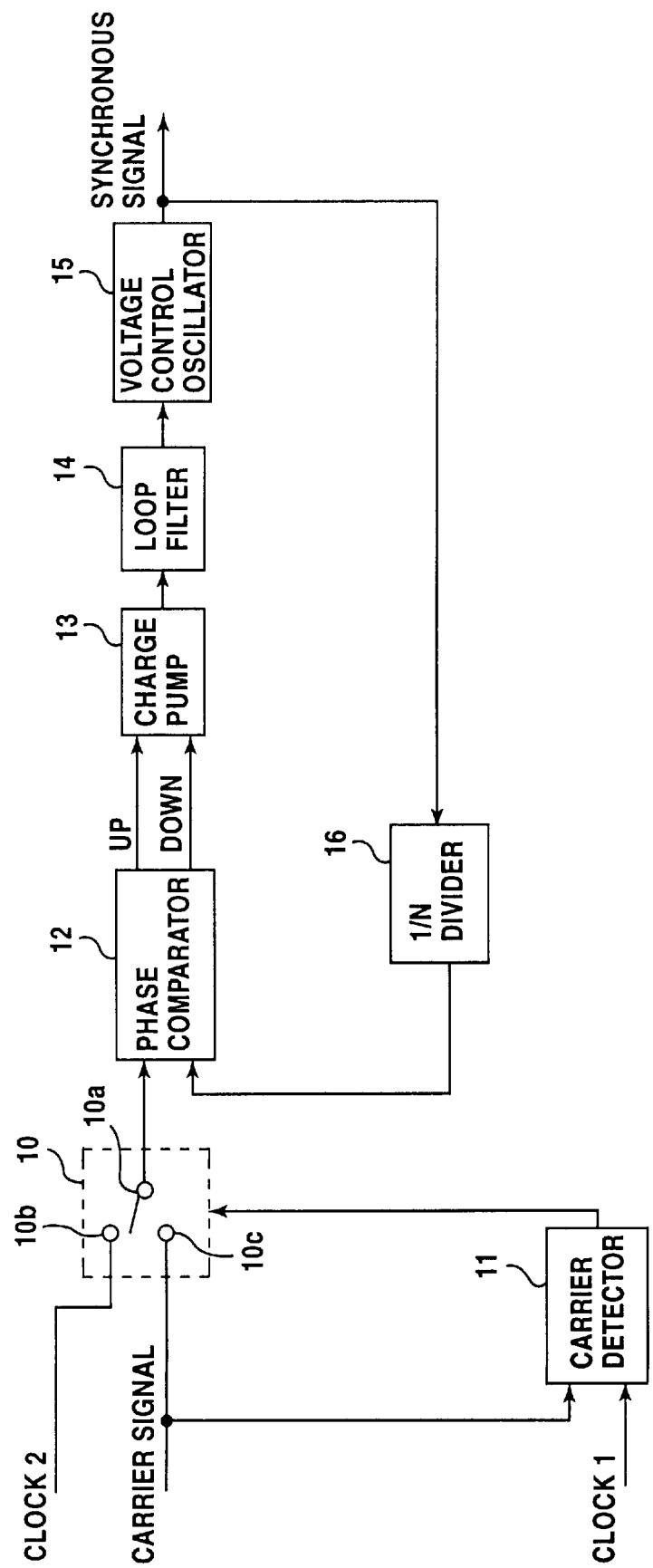
FIG. 2 is a block diagram showing schematic configuration of the semiconductor integrated circuit according to Embodiment 1 of the present invention.

FIG. 2 is a block diagram showing schematic configuration of a semiconductor integrated circuit according to Embodiment 1. In FIG. 2, the semiconductor integrated circuit according to Embodiment 1 comprises a signal switching circuit 10, a carrier detector 11, a phase comparator 12, a charge pump 13, a loop filter 14, a voltage control oscillator 15, and a 1/N divider 16.

Herein, especially a case where the signal switching circuit 10, carrier detector 11, phase comparator 12, charge pump 13, loop filter 14, voltage control oscillator 15, and 1/N divider 16 are configured by a digital circuit is described, and this semiconductor integrated circuit functions as a PLL circuit for obtaining a synchronous signal to the carrier signal by inputting therein signals (carrier signal) for converting a carrier of, for instance, an FSK signal to square waves due to A/D conversion as an input signal.

In FIG. 2, the signal switching circuit 10 is a circuit comprising a switch enabling switching of connection with a common contact 10a to either of a switching contact 10b or a switching contact 10c. In the signal switching circuit 10, the common contact 10a is connected to a terminal of the phase comparator 12 to which an input signal is inputted, the switching contact 10b connected to an external oscillator not shown receives the clock 2 and the switching contact 10c receives a carrier signal. The clock 2 is a clock signal that oscillates at a frequency equivalent to that of the carrier signal.

As described above, the signal switching circuit 10 can select either of the clock 2 or the carrier signal as a signal to be inputted into the phase comparator 12. For example, when a detection signal outputted from the carrier detector 11 indicates a high level the common contact 10a is connected to the switching contact 10c in which the carrier signal is inputted, and when a detection signal outputted from the carrier detector 11 indicates a low level the common contact 10a is connected to the switching contact 10b in which the clock 2 is inputted.

The phase comparator 12 comprises an EX-OR circuit or a R-S type of flip-flop circuit, and compares a timing of the rising point of a signal outputted from the signal switching circuit 10 (described a selected input signal hereinafter) to that of an oscillation signal (described an internal oscillation signal hereinafter) as a feedback signal to the voltage control oscillator 15 inputted through the 1/N divider 16, and when the rising of the internal oscillation signal is delayed with respect to the selected input signal, namely when a frequency of the selected input signal is lower than that of the internal oscillation signal, a signal UP at a low level is inputted into the charge pump 13 for that period of time.

On the other hand, when the rising of the internal oscillation signal is leading with respect to the selected input signal, namely when a frequency of the selected input signal is higher than that of the internal oscillation signal, a signal DOWN at a high level is inputted into the charge pump 13 for that period of time.

The charge pump 13 is a circuit for feeding a current for driving the loop filter 14 provided in the next stage, it feeds a positive current to the loop filter 14 provided in the next stage when the signal UP indicating a low level is received from the phase comparator 12, and feeds a negative current to the loop filter 14 provided in the next stage when the signal DOWN indicating a high level is received therefrom.

The loop filter 14 is a low-pass filter which removes unnecessary higher harmonics and noise and also generates a positive or negative control voltage for controlling the voltage control oscillator 15 provided in the next stage according to the current supplied from the charge pump 13. The voltage control oscillator 15 is an oscillator for outputting a signal with a frequency decided according to the control voltage outputted from the charge pump 13, it can obtain this oscillation signal as a synchronous signal. Further, this oscillation signal is inputted into the 1/N divider 16.

The 1/N divider 16 subjects the oscillation signal from the voltage control oscillator 15 to 1/N-division so that the frequency of the oscillation signal from the voltage control oscillator 15 coincides with the frequency of the selected input signal, and outputs the subjected signal as an internal oscillation signal. A negative feedback loop for receiving an output signal as an input signal is formed by inputting again this internal oscillation signal in the phase comparator 12.

As described above, the semiconductor integrated circuit according to Embodiment 1 increases the frequency of the internal oscillation signal by feeding a positive voltage corresponding to the phase difference to the voltage control oscillator 15 as a control signal when the phase of an internal oscillation signal is delayed with respect to a selected input signal. Namely, a higher frequency can make the phase lead. On the other hand, when the phase of the internal oscillation signal leads the selected input signal, the frequency of the internal oscillation signal is lowered by feeding a negative voltage corresponding to the difference to the voltage control oscillator 15 as a control signal. Namely a lower frequency can make the phase delayed.

The locked state that the internal oscillation signal is coincident with the selected input signal in its frequency as well as phase thereof is effected by the action of the negative feedback as described above, which allows a synchronous signal accurately indicating a frequency of the selected input signal to be outputted.

Next, description is made for the carrier detector 11. The carrier detector 11 is a circuit for receiving a carrier signal and a clock 1 generated in an external oscillator not shown in the figure, detecting whether the carrier signal is cut off or whether a carrier signal outside an effective range of a frequency is inputted, and outputting a detection signal, for example, as a low-level signal.

Figure 3:
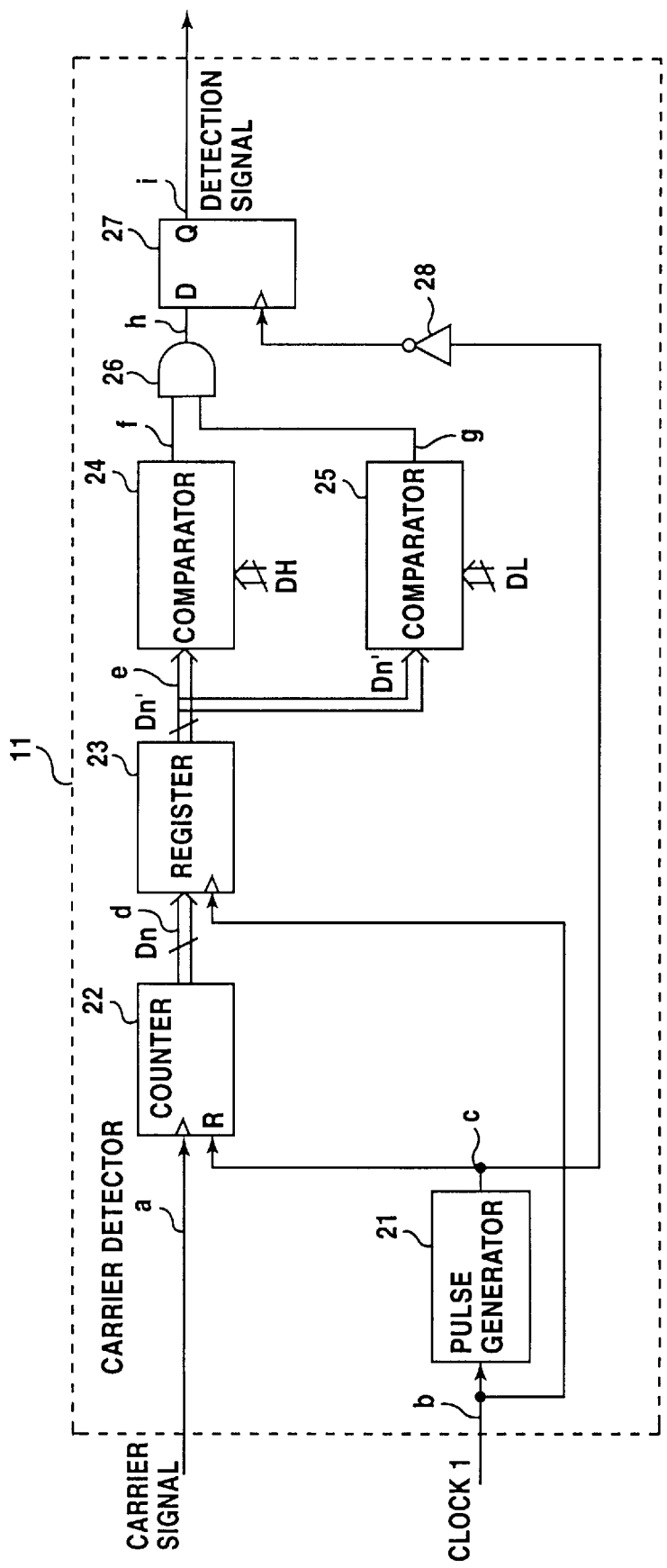
FIG. 3 is a block diagram showing internal configuration of the carrier detector in the semiconductor integrated circuit according to Embodiment 1.

FIG. 3 is a block diagram showing internal configuration of the carrier detector 11. In FIG. 3, the carrier detector 11 comprises a pulse generator 21, a counter 22, a register 23, comparators 24 and 25, a AND gate 26, a D flip-flop 27, and an inverter 28.

The pulse generator 21 is a circuit for receiving a clock 1 and outputting a pulse with a smaller pulse width than that of the clock 1 on rising of the clock 1. The pulse generator 21 is realized by a device such as an one-shot multi-vibrator.

The counter 22 is a circuit for receiving a carrier signal and counting a pulse number (Dn) of this carrier signal. The counter 22 is reset by the entry of a pulse outputted from the pulse generator 21. The register 23 is a circuit for receiving a clock 1, obtaining and storing therein a value (Dn') indicating a counted result by the counter 22 on rising of the clock 1.

The comparator 24 compares the value (Dn') stored in the register 23 to an upper limit of a recognizable frequency range as a normal carrier signal, namely a value (DH) indicating an effective highest frequency, and outputs a high-level signal as a result of comparison (a condition comparison signal) when Dn' is smaller than DH.

On the other hand, the comparator 25 compares the value (Dn') stored in the register 23 to a lower limit of a recognizable frequency range as a normal carrier signal, namely a value (DL) indicating an effective lowest frequency, and outputs a high-level signal as a result of comparison (a condition comparison signal) when Dn' is larger than DL.

The AND gate 26 receives the results of comparison outputted from the comparator 24 and comparator 25 respectively and inputs an output signal into a D terminal of the D flip-flop 27 provided in the next stage. Also the inverter 28 inputs a signal obtained by inverting the pulse outputted from the pulse generator 21 into a clock terminal of the D flip-flop 27.

The D flip-flop 27 stores therein an output signal from the AND gate 26 when the signal outputted from the inverter 28 rises, and outputs the stored signal as a detection signal.

Figure 4:
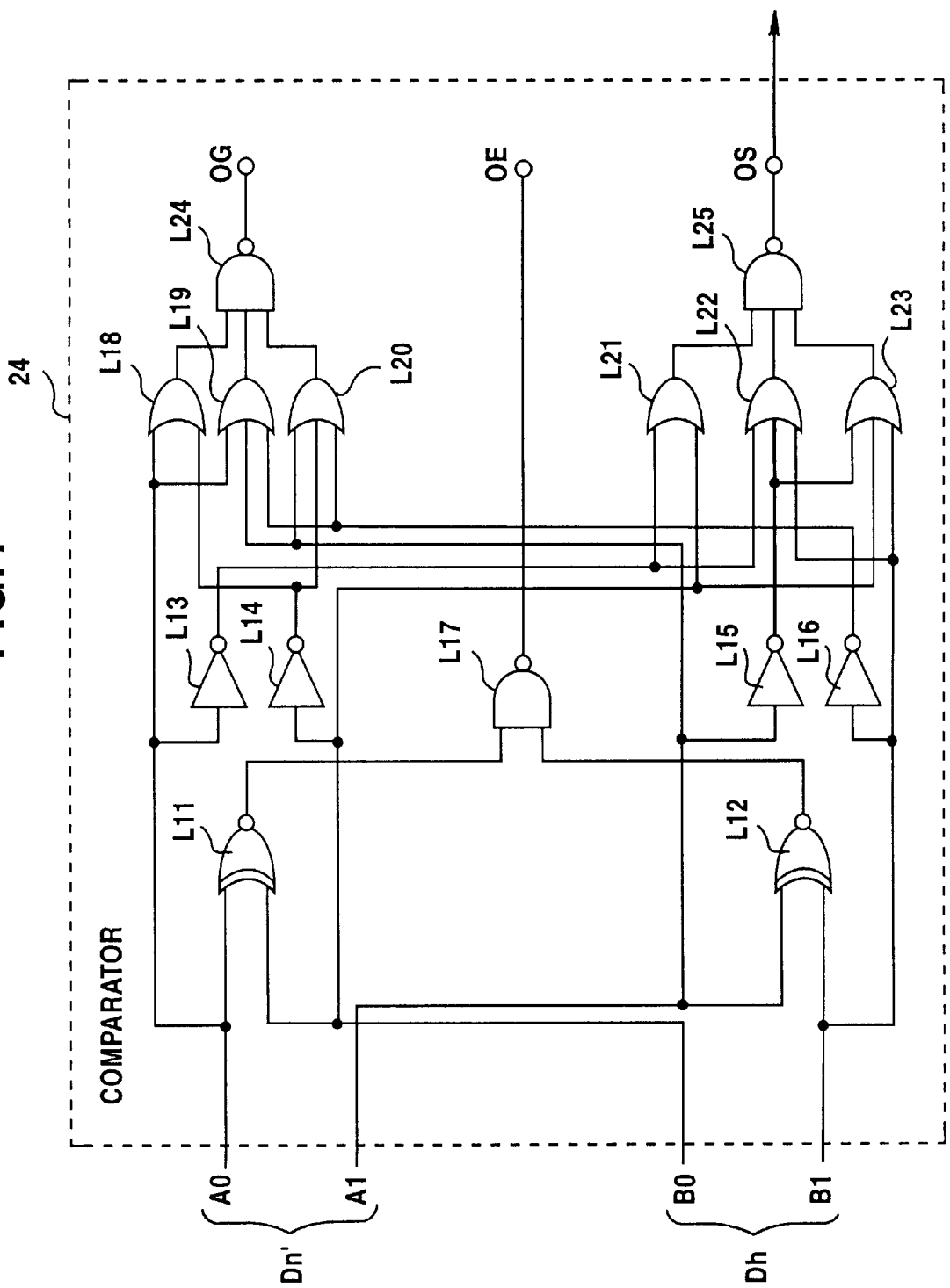
FIG. 4 is an explanatory view showing circuit configuration of the comparator in the semiconductor integrated circuit according to Embodiment 1.

Next, description is made for circuit configuration of the comparator 24. FIG. 4 is an explanatory view showing circuit configuration of the comparator 24. It should be noted that the comparator 24 shown in FIG. 4 is a circuit used when a result of comparison of entry value (Dn') expressed in 2 bits (A1, A0) with a value (DH) expressed in 2 bits (B1, B0) is outputted as an example. The comparator 24 can perform comparison even if Dn' and DH are values each expressed in 2 bits or more by being configured the same as the circuit shown in FIG. 4.

In FIG. 4, the comparator 24 comprises two EXOR gates L11 and L12, four inverters L13 to L16, one AND gate L17, six OR gates L18 to L23, and two 3-entry AND gates L24 and L25, and of the gates, the OR gates L19, L20, L22, and L23 are 3-entry OR gates respectively.

The comparator shown in FIG. 4 has three terminals OS, OE, and OG each for outputting a comparison result, and when it is determined that the value (Dn') expressed by (A1, A0) is larger than a value (DH) expressed by (B1, B0) as a result of comparison, a high-level signal is outputted to an output terminal OG, a high-level signal is outputted to an output terminal OS when it is determined that Dn' is smaller than DH, and a high-level signal is outputted to an output terminal OE when it is determined that Dn' is equal to DH. This comparator 24 processes a signal outputted especially from the terminal OS as a detection signal.

In FIG. 4, the bit A0 is inputted into one of input terminals of the EXOR gate L11, input terminal of the inverter L13, one of input terminals of the OR gate L18, and into a first input terminal of the OR gate L19 respectively, while the bit A1 is inputted into one of input terminals of the EXOR gate L12, input terminal of the inverter L15, the second input terminal of the OR gate L19, and into a first input terminal of the OR gate L20 respectively.

The bit B0 is inputted into the other input terminal of the EXOR gate L11, input terminal of the inverter L14, one of input terminals of the OR gate L21, and into the first input terminal of the OR gate L23 respectively, while the bit B1 is inputted into the other input terminal of the EXOR gate L12, input terminal of the inverter L16, the first input terminal of the OR gate L22, and into the second input terminal of the OR gate L23 respectively.

Output from the EXOR gate L11 is inputted into one of input terminals of the AND gate L17, and output from the EXOR gate L12 is inputted into the other input terminal of the AND gate L17. Output terminal of the AND gate L17 is connected to the terminal OE.

Output from the inverter L13 is inputted into the other input terminal of the OR gate L21 as well as in the second input terminal of the OR gate L22, while output from the inverter L14 is inputted into the other input terminal of the OR gate L18 as well as in the second input terminal of the OR gate L20 respectively. Output from the inverter L15 is inputted into the third input terminal of the OR gate L22 as well as in the third input terminal of the OR gate L23, while output from the inverter L16 is inputted into the third input terminal of the OR gate L19 as well as into the third input terminal of the OR gate L20 respectively.

Each output from the OR gates L18 to L20 is inputted into the NAND gate L24, and each output from the OR gates L21 to L23 is inputted into the NAND gate L25. An output terminal of the NAND gate L24 is connected to the terminal OG and an output terminal of the NAND gate L25 is connected to the terminal OS.

Next, description is made for an operation of the comparator 24. FIG. 5 is a truth table showing a relation between (A1, A0) indicating Dn', (B1, B0) indicating DH, and each output signal in the terminals OS, OE, and OG. It should be noted that, as a signal outputted from the terminal OS, a case where the terminal OS outputs a high-level signal and a case where it outputs a low-level signal are considered herein.

As a combination of (A1, A0) with (B1, B0) when (A1, A0) indicating Dn' is smaller than (B1, B0) indicating DH, namely when the terminal OS outputs a high-level signal, there are six types of combinations such as {(A1, A0), (B1, B0)}={(0, 0), (0, 1)}, {(0, 0), (1, 0)}, {(0, 1), (1, 0)}, {(0, 0), (1, 1)}, {(0, 1), (1, 1)} and {(1, 0), (1, 1)}.

Description is made for an operation of the comparator 24 in the case of {(A1, A0), (B1, B0)}={(0, 0), (0, 1)} out of the above combinations, with reference to the circuit configuration shown in FIG. 4.

At first, as values are equal such as (A0, B0)=(1, 0), the output from the EXOR gate L11 indicates a low level, namely logic "0". As values are equal such as (A1, B1)=(0, 1), the output from the EXOR gate L12 also indicates a low level, namely logic "0". Thus, the output from the AND gate L17 indicates logic "0", so that a low-level signal is outputted to the terminal OE. The outputs from the inverters L13 to L16 indicate logic "0", "1", "1", and "0" respectively. Accordingly, the logic "1", "1" is inputted into the OR gate L18, which outputs the logic "1", the logic "1", "0", "0", is inputted into the OR gate L19, which outputs the logic "1", and the logic "0", "1", "0" is inputted into the OR gate L20, which outputs the logic "1".

Therefore, the output from the NAND gate L24 indicates the logic "0", and a low-level signal is outputted to the terminal OG. The same processing is subjected to each of the remaining five combinations of (A1, A0) with (B1, B0), and a low-level signal is outputted to the terminal OG.

The logic "0", "0" is inputted into the OR gate L21, which outputs the logic "0", the logic "0", "1", "1" is inputted into the OR gate L22, which outputs the logic "1", and the logic "1", "0", "1" is inputted in the OR gate L23, which outputs the logic "1". Therefore, the output from the NAND gate L25 indicates the logic "1", and a high-level signal is outputted to the terminal OS. Namely, it is indicated that the value (Dn') expressed by (A1, A0) is smaller than the value (DH) expressed by (B1, B0).

Other than the six combination of (A1, A0) with (B1, B0), namely when the value (Dn') expressed by (A1, A0) is larger than the value (DH) expressed by (B1, B0), a low-level signal is outputted to the output terminal OS.

The comparator 25 has the same configuration and operation as those of the comparator 24 described above. It should be noted that, the comparator 25 outputs a high-level detection signal when Dn' is larger than DL in therefore, a terminal to which the detection signal is outputted should be the terminal OG.

Figure 6:
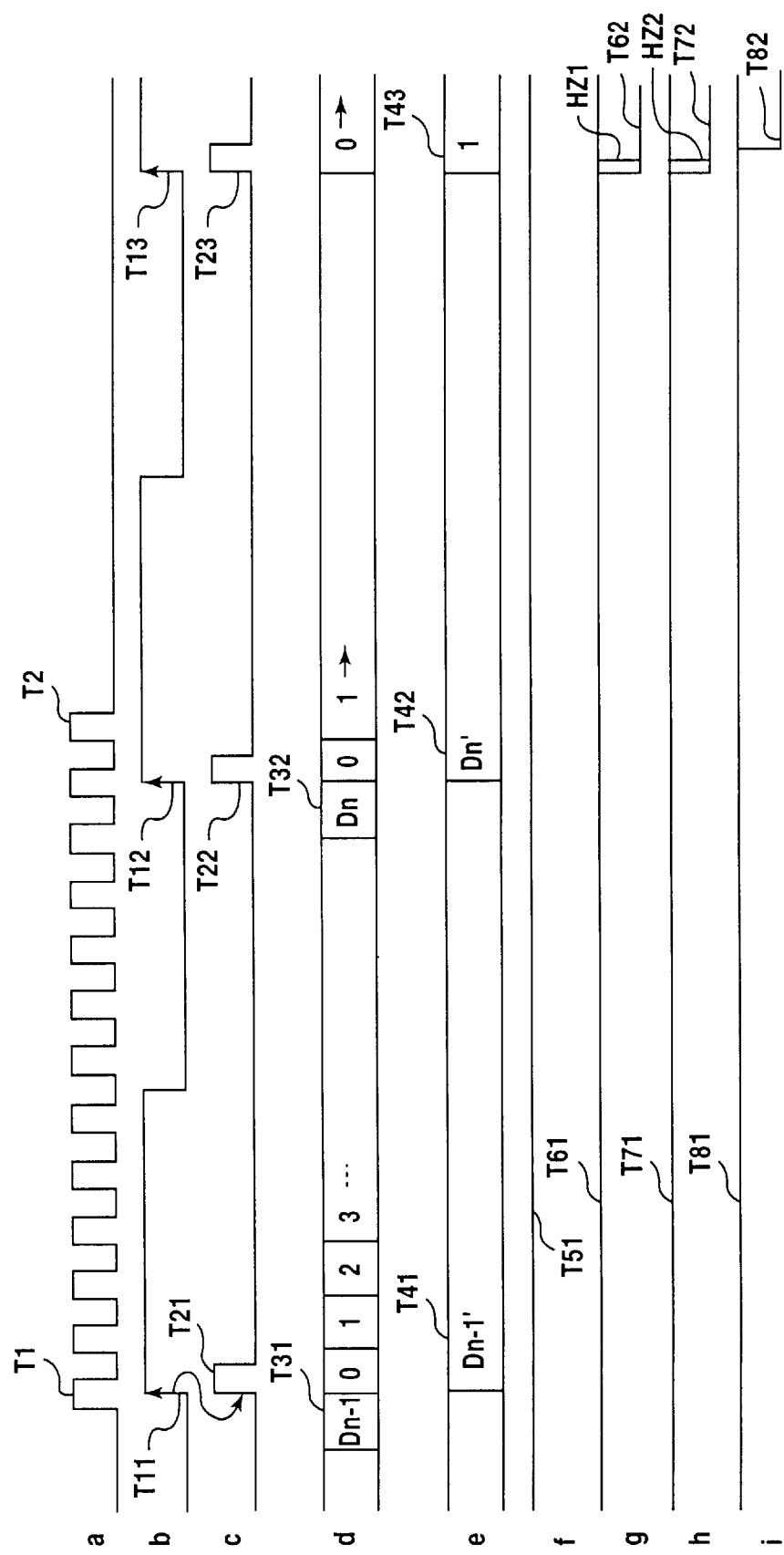
FIG. 6 is a time chart for explaining the operation of the carrier detector in the semiconductor integrated circuit according to Embodiment 1.

Next, description is made for an operation of the carrier detector 11. FIG. 6 is a time chart for explaining the operation of the carrier detector 11. In the time chart of FIG. 6, the reference signs a to i correspond to the positions a to i shown in FIG. 3, and show status of the signals on these positions respectively.

In FIG. 6, at first, a pulse T21 is outputted from the pulse generator 21 with the rising T11 of a clock 1. Also, the register 23 obtains an output signal T31 indicating a value (Dn–1) as a result of counting in the counter 22 and stores the signal therein with the rising T11 of the clock 1. The counter 22 is reset by the pulse T21 outputted from the pulse generator 21, and new counting of clocks according to a carrier signal is started.

A signal T41 indicating a value (Dn–1') stored in the register 23 is inputted into the comparators 24, 25, and it is determined whether the signal is within an effective range of a frequency or not. When it is determined that (Dn–1') is less than the value (DH) indicating the highest frequency, the comparator 24 outputs a signal T51 indicating a high level, on the other hand, when it is determined that (Dn–1') is greater than the value (DL) indicating the lowest frequency, the comparator 25 outputs a signal T61 indicating a high level.

Therefore, the AND gate 26 receives two signals each indicating a high level and outputs a signal T71 indicating a high level. Herein, the pulse T21 outputted from the pulse generator 21 is inverted in the inverter 28 and inputted into a clock terminal of the D flip-flop 27, so that the D flip-flop 27 receives the signal T71 indicating a high level outputted from the AND gate 26 after a period of time equal to a pulse width of the pulse T21 and stores the signal therein. This stored signal is outputted as a detection signal T81 indicating a high level.

Then, a pulse T22 is again outputted from the pulse generator 21 with the rising T12 of the clock 1. Also, the register 23 obtains an output signal T32 indicating a value (Dn) as a result of counting in the counter 22 with the rising T12 of the clock 1 and stores the signal therein.

A signal T42 indicating a value (Dn') stored in the register 23 is inputted into the comparators 24, 25, and it is determined whether the signal is within an effective range of a frequency or not. when it is determined that (Dn−1') is less than the value (DH) indicating the highest frequency in the comparator 24 as well as (Dn−1') is greater than the value (DL) indicating the lowest frequency in the comparator 25, both the comparators 24 and 25 output signals T51 and T61 each indicating a high level.

Therefore, the AND gate 26 receives two signals each indicating a high level and outputs the signal T71 indicating a high level. Herein, as described above, the D flip-flop 27 receives the signal T71 indicating a high level outputted from the AND gate 26 after a period of time equal to a pulse width of the pulse T22, stores the signal therein, and outputs this stored signal indicating a high level as the detection signal T81.

Then, when a carrier signal to be counted with the pulse T22 as a trigger is cut off with the pulse T2 which is the last one, namely in a state where a result of counting keeps on showing "1" in the counter after the rising T12 of the clock 1 and on, and further when the clock 1 shows a new rising T13, a pulse T23 is outputted from the pulse oscillator 21, "1" is stored in the register 23, and a signal T43 indicating this "1" is also inputted into the comparator 24 as well as in the comparator 25.

The comparator 24 outputs a signal T51 indicating a high level because the value "1" inputted therein is less than the value DH indicating the highest frequency, but the comparator 25 outputs a signal T62 indicating a low level because the value "1" inputted therein is less than the value DL indicating the lowest frequency. In response to this output a signal T72 indicating a low level is also outputted from the AND gate 26.

Then, the signal T72 indicating a low level outputted from the AND gate 26 is inputted and stored in the D flip-flop 27, after a period of time equal to a pulse width of the pulse T22 as described above, and a signal T82 indicating the stored low-level signal is outputted as a detection signal.

Herein, the comparator 24 and comparator 25 are asynchronously operated, therefore, hazard HZ1 and HZ2 may occur at the time of transition from the high level to the low level of the signals in each output from the comparators as well as in the output from the AND gate 26 following the outputs. The D flip-flop 27 operates in synchronism with a clock signal according to a pulse outputted from the pulse oscillator 21, therefore, occurrence of hazard in the signal to be outputted is prevented.

The time chart shown in FIG. 6 shows a case where a carrier signal is cut off, and if a frequency of the carrier signal is less than the value indicating the lowest frequency inputted into the comparator 25, the same operation is effected. Also even if the frequency of the carrier signal is more than the value indicating the highest frequency inputted into the comparator 24, a signal outputted from comparator 24 indicates a low level and the AND gate 26 also outputs a signal indicating a low level, therefore the operation is resultantly the same as that described above.

As described above, a detection signal outputted from the carrier detector 11 as explained above shows a low level when no carrier signal is inputted or when a carrier signal outside an effective range of a frequency is inputted. The signal switching circuit 10 connects, after receiving this low-level detection signal, the common contact 10a to the switching contact 10b to which a clock 2 is supplied, and selects the clock 2 as an input signal to be inputted into the phase comparator 12.

The phase comparator 12 keeps, in order to maintain the locked state to the inputted clock 2, the locked state even when no carrier signal is inputted or a carrier signal outside an effective range of a frequency is inputted, and when an effective carrier signal is detected again in the carrier detector 11, namely when a high-level signal is inputted into the signal switching circuit 10 as a detection signal, the carrier signal is inputted into the phase comparator 12, and a synchronous signal can speedily be received by hardly generating a lock-up time.

Figure 7:
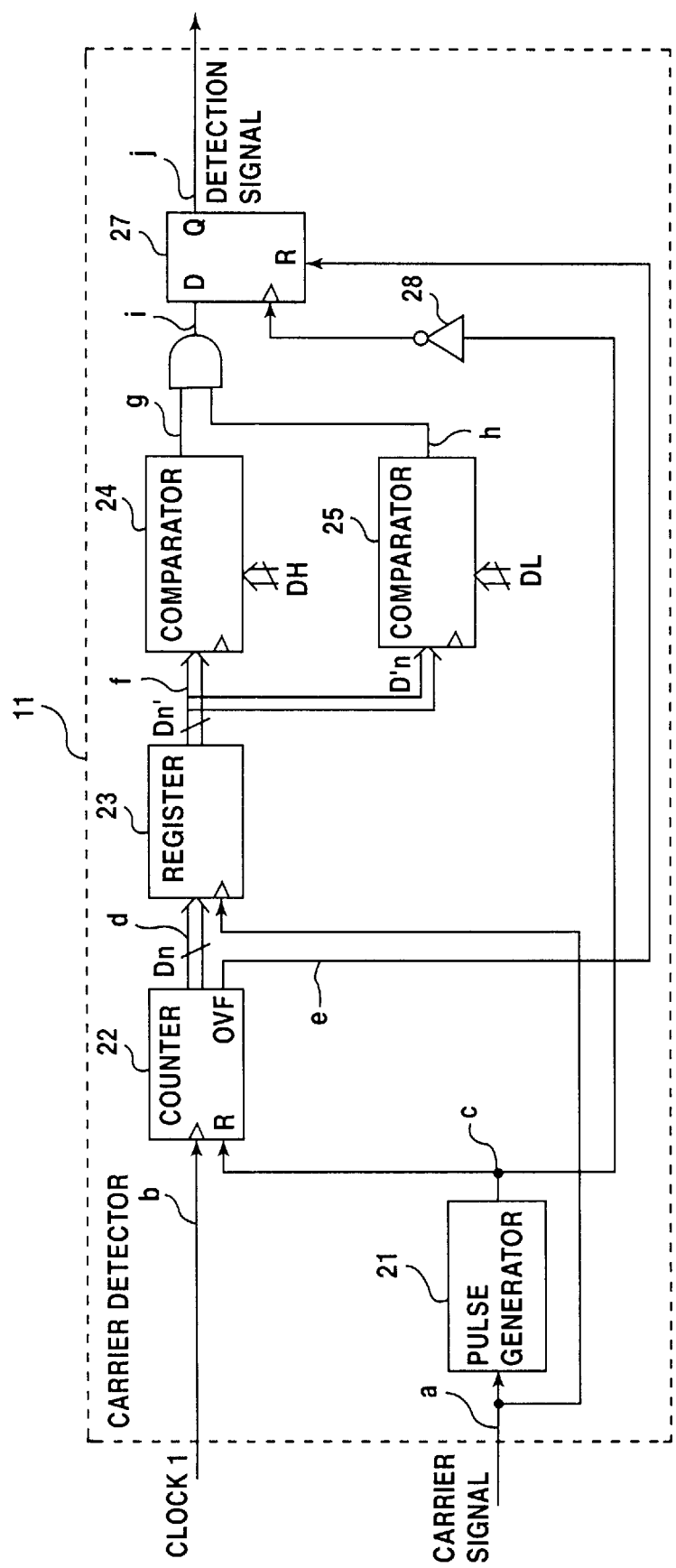
FIG. 7 is a block diagram showing schematic configuration of another carrier detector in the semiconductor integrated circuit according to Embodiment 1.

Next, description is made for another example of the carrier detector 11. FIG. 7 is a block diagram showing schematic configuration of another carrier detector 11. The carrier detector 11 shown in FIG. 7 is different from the carrier detector 11 shown in FIG. 3 in points that a clock 1 is inputted into the counter 22, a carrier signal is inputted into the pulse generator 21, and that a signal indicating an overflow in the counter 22 is inputted into a reset terminal (R) of the D flip-flop 27.

However, oscillation frequency of the clock 1 is required to be sufficiently higher than that of the carrier signal. It should be noted that, the same reference numerals are assigned to sections common to those in FIG. 3, and description thereof is omitted herein.

Figure 8:
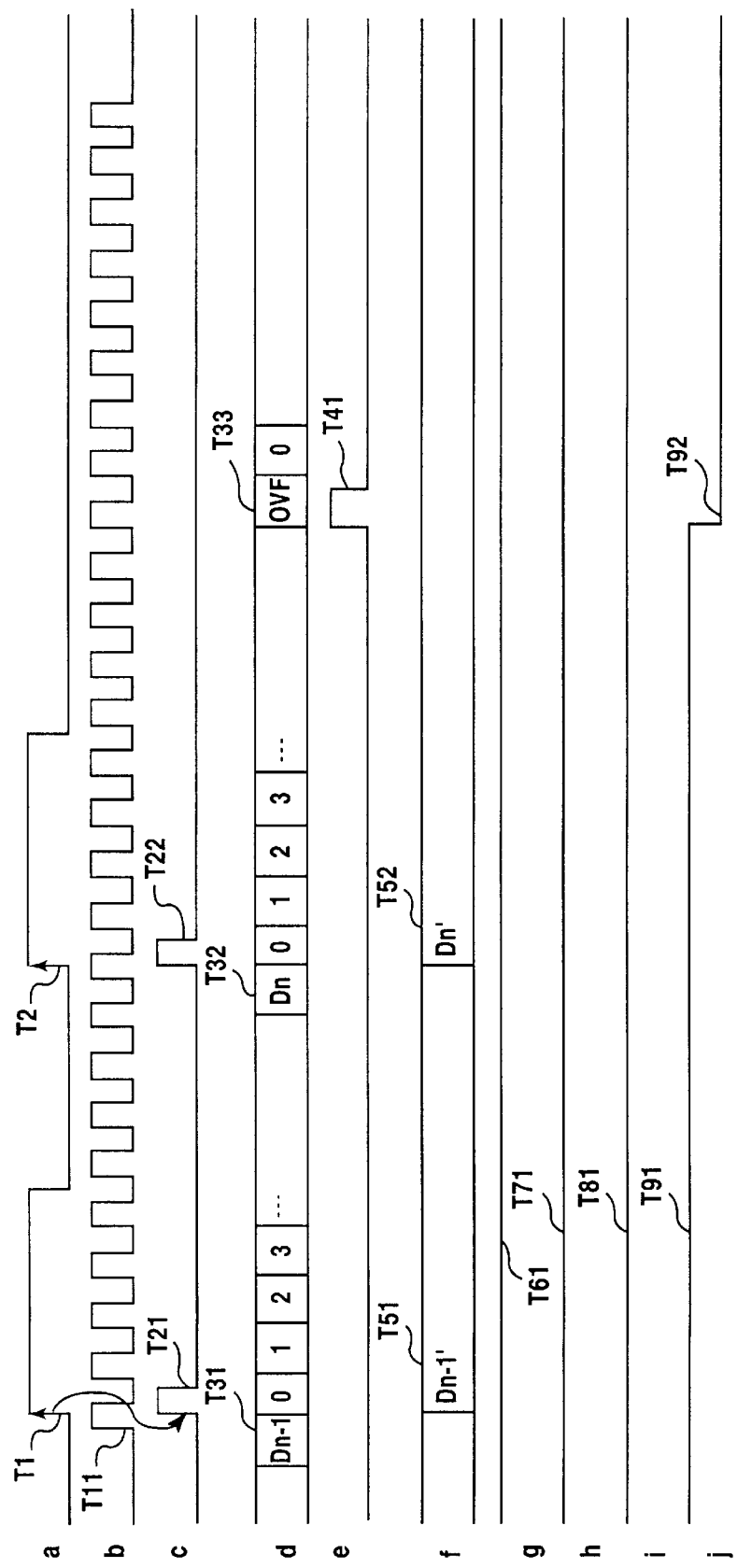
FIG. 8 is a time chart for explaining an operation of another carrier detector in the semiconductor integrated circuit according to Embodiment 1.

FIG. 8 is a time chart for explaining an operation of the carrier detector 11 shown in FIG. 7. In the time chart of FIG. 8, the reference signs a to j correspond to positions a to j shown in FIG. 7, and show states of signals in the positions respectively.

In FIG. 8, at first, a pulse T21 is outputted from the pulse generator 21 with the rising T1 of a carrier signal. Also, the register 23 obtains an output signal T31 indicating a value (Dn−1) as a result of counting in the counter 22 and stores the signal therein with the rising T1 of the carrier signal. The counter 22 is reset by the pulse T21 outputted from the pulse generator 21 and new counting of the clock 1 is started.

A signal T51 indicating a value (Dn−1') stored in the register 23 is inputted into the comparators 24 and 25, and it is determined whether the signal is within an effective range of a frequency or not. When it is determined that Dn−1' is less than the value (DH) indicating the highest frequency the comparator 24 outputs a signal T61 indicating a high level, on the other hand, when it is determined that Dn−1' is greater than the value (DL) indicating the lowest frequency the comparator 25 outputs a signal T71 indicating a high level.

Therefore, the AND gate 26 receives two signals each indicating a high level, and outputs a signal T81 indicating a high level. Herein, the pulse T21 outputted from the pulse generator 21 is inverted in the inverter 28, and inputted into a clock terminal of the D flip-flop 27, so that the D flip-flop 27 receives the signal T71 indicating a high level outputted from the AND gate 26 after a period of time equal to a pulse width of the pulse T21 and stores the signal therein. This stored signal is outputted as a detection signal T91 indicating a high level.

Then, a pulse T22 is again outputted from the pulse generator 21 with the rising T2 of the carrier signal. Also, the register 23 obtains an output signal T32 indicating a value (Dn) as a result of counting in the counter 22 with the rising T2 of this carrier and stores the signal therein.

A signal T52 indicating a value (Dn') stored in the register 23 is inputted into the comparators 24 and 25, and it is determined whether the signal is within an effective range of a frequency or not. When it is determined that Dn−1' is less than the value (DH) indicating the highest frequency in the comparator 24 and that Dn−1' is greater than the value (DL) indicating the lowest frequency in the comparator 25, both the comparators 24 and 25 output signals T61 and T71 each indicating a high level.

Therefore, the AND gate 26 receives two signals each indicating a high level, and outputs the signal T81 indicating a high level. Herein, as described above, the D flip-flop 27 receives the signal indicating a high level outputted from the AND gate 26 after a period of time equal to a pulse width of the pulse T22, stores the signal therein, and outputs this stored signal indicating a high level as the detection signal T91.

Then, when a carrier signal is cut off with the pulse T22 indicating the rising T2 which is the last one, namely in a state where counting of the clock 1 is continued after the rising T2 of the carrier signal and on, a pulse from the pulse oscillator 21 according to the carrier signal is not outputted, hence the counter 22 will not be reset.

In this state, as a pulse outputted from the pulse oscillator 21 is not inputted into the D flip-flop 27 as a clock input, hence the D flip-flop 27 maintains the high-level signal stored therein last time, hence a cut-off of the carrier signal can not be detected.

However, the counting by the counter 22 results in an inevitable overflow, and then the counter 22 outputs an overflow signal (OVF) T41 indicating a high level, and the D flip-flop 27 receives this overflow signal T41 in the reset terminal thereof, so that the data (a high-level signal in this case) stored on the rising of the overflow signal T41 can be reset to a low level. With this feature, a detection signal T92 indicating a low level is outputted from the D flip-flop 27, which allows a cut-off of the carrier signal to be detected.

Although the time chart shown in FIG. 8 shows especially the case where a carrier signal is cut off, the case where a frequency of a carrier signal is outside an effective range can be detected by the comparator 24 or the comparator 25. It should be noted that, the clock 1 is an object for counting by the counter 22, a pulse number of the clock 1 during the first transitional period of the pulse for the carrier signal is a result of counting by the counter 22 to be stored in the register 23.

Namely, higher is the frequency of a carrier signal narrower is the rising interval of a pulse of a carrier signal, and smaller is the pulse number of the clock 1 to be counted during this interval. The lower is the frequency of a carrier signal, the wider is the rising interval of a pulse of a carrier signal, and larger is the pulse number of the clock 1 to be counted during this interval.

Accordingly, the comparator 24 outputs a low-level signal when a counted result stored in the register 23 is smaller than the value indicating the highest frequency, namely than the pulse number (DH) of the clock 1 between pulses of the carrier signal with the highest frequency. On the other hand, the comparator 25 outputs a low-level signal when a counted result stored in the register 23 is larger than the value indicating the lowest frequency, namely than the pulse number (DH) of the clock 1 between pulses of the carrier signal with the lowest frequency. With those low-level signals, the AND gate 26 also outputs a signal indicating a low-level, therefore, the operation thereof results in the same as the operation in the carrier detector 11 shown in FIG. 3 as described above.

With Embodiment 1 described above, when no carrier signal is inputted or when a carrier signal outside an effective range of a frequency is inputted by the carrier detector 11, a detection signal indicating a low level is outputted, and the signal switching circuit 10 inputs a clock 2 having a frequency equivalent to the normal carrier signal into the phase comparator 12 by receiving this detection signal indicating a low level, and inputs the carrier signal into the phase comparator 23 when the detection signal indicates a high level, so that, even when no carrier signal is inputted or when a carrier signal outside an effective range of a frequency is inputted, the locked state is not unlocked, and a lock-up time required when an effective carrier signal is detected again can be reduced, which allows high-speed as well as stable phase locking to be achieve.

Figure 9:
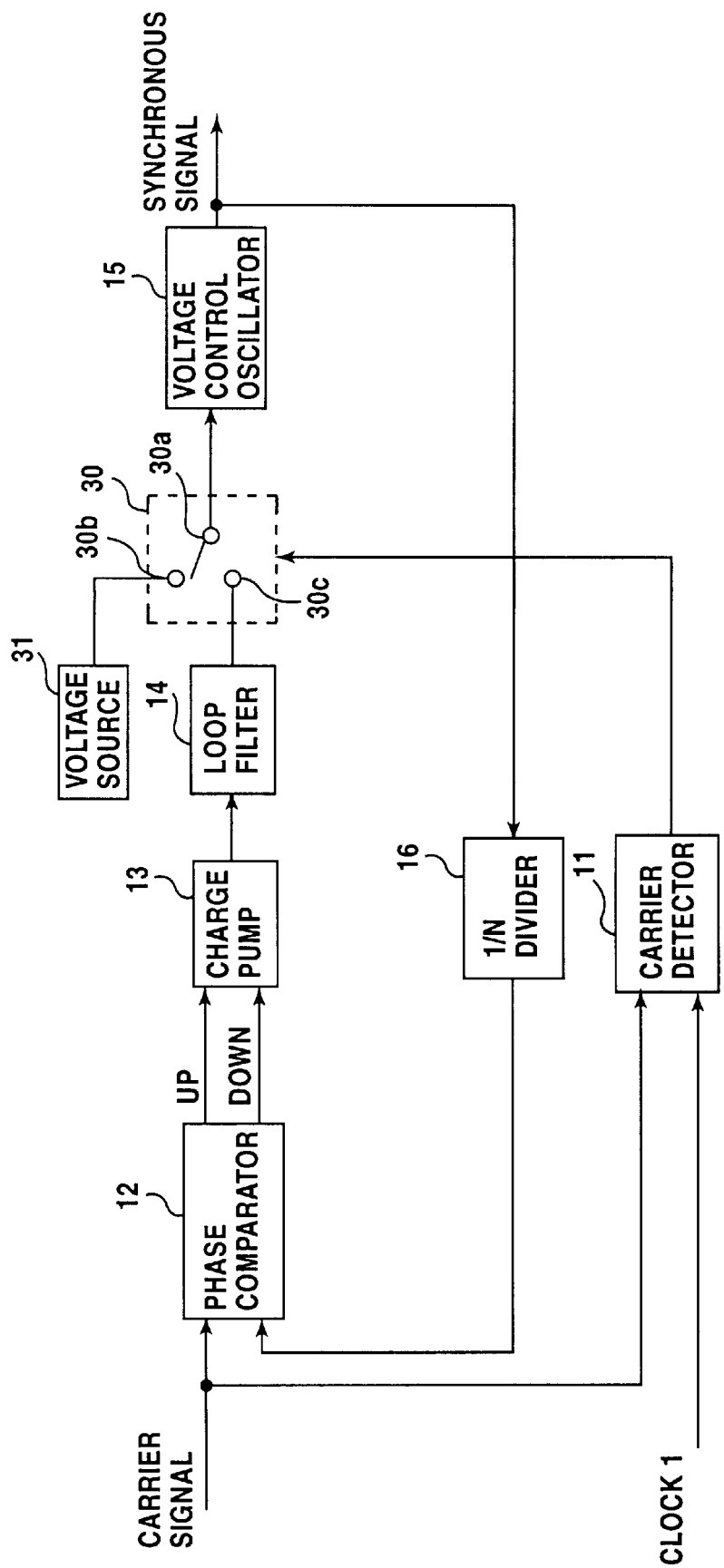
FIG. 9 is a block diagram showing schematic configuration of the semiconductor integrated circuit according to Embodiment 2 of the present invention.

Next, a semiconductor integrated circuit according to Embodiment 2 is described. FIG. 9 is a block diagram showing schematic configuration of the semiconductor integrated circuit according to Embodiment 2. In FIG. 9, the semiconductor integrated circuit according to Embodiment 2 comprises a carrier detector 11, a phase comparator 12, a charge pump 13, a loop filter 14, a voltage control oscillator 15, a 1/N divider 16, and a signal switching circuit 30. Same reference numerals are assigned to sections common to those in FIG. 2 according to Embodiment 1 and description thereof is omitted herein.

In FIG. 9, the signal switching circuit 30 is a circuit comprising a switch enabling switching of connection with a common contact 30a to either of a switching contact 30b or a switching contact 30c according to a detection signal outputted from the carrier detector 11. In the signal switching circuit 30, the common contact 30a is connected to a terminal of the voltage control oscillator 15 with a control signal inputted therein, the switching contact 30b is connected to a voltage source 31, and the switching contact 30b is connected to an output terminal of the loop filter 14.

The voltage source 31 is a voltage source for suppling a voltage equivalent to a control voltage generated in the loop filter 14 when a normal carrier signal is inputted into the phase comparator 12.

As for a specific operation of the signal switching circuit 30, when no carrier signal is inputted, or when a carrier signal outside an effective range of a frequency is inputted therein, a low-level detection signal outputted from the carrier detector 11 is inputted into the signal switching circuit 30, due to which the common contact 30a is connected to the switching contact 30b and a control voltage supplied by the voltage source 31 is inputted into the voltage control oscillator 15.

The voltage control oscillator 15 outputs an oscillation signal with a frequency correlated to the control voltage supplied by the voltage source 31 as a result of synchronous detection, and also inputs the signal in the 1/N divider 16. In this state, output from the loop filter 14 is not inputted into the voltage control oscillator 15, but an oscillation signal according to the voltage supplied by the voltage source 31 is inputted from the voltage control oscillator 15 into the phase comparator 12 through the 1/N divider 16.

Herein, when an effective carrier signal is inputted again into the phase comparator 12, a high-level detection signal is outputted from the carrier detector 11, and this detection signal is inputted into the signal switching circuit 30, due to which the common contact 30a is connected to the switching contact 30c, and output from the loop filter 14 is inputted into the voltage control oscillator 15 as a control signal.

The oscillation signal according to the voltage supplied by the voltage source 31 has been inputting from the voltage control oscillator 15 into the phase comparator 12 through the 1/N divider 16 till the time just before the switching of the contact to the switching contact 30c is performed in this signal switching circuit 30, therefore, different from a case where a phase of a carrier signal and that of a signal not oscillated from the 1/N divider or of a signal with a substantially different frequency are compared to each other, the signal having been inputted into the phase comparing circuit 12 has a frequency sufficiently close to that of the carrier signal, which allows high-speed phase locking to be performed and a synchronous signal to speedily be obtained.

With the Embodiment 2 as described above, when no carrier signal is inputted or when a carrier signal outside an effective range of a frequency is inputted, a detection signal indicating a low level is outputted by the carrier detector 11, and the signal switching circuit 30 inputs, by receiving this detection signal indicating a low level, a control signal to make the oscillator output a frequency equivalent to a normal carrier signal in the voltage control oscillator 15 from the voltage source 31, and inputs the output from the loop filter 14 in the voltage control oscillator 15 when the detection signal indicates a high level, therefore, even when no carrier signal is inputted or when a carrier signal outside an effective range of a frequency is inputted therein, an internal oscillation signal can be inputted into the phase comparator 12, hence a lock-up time required when an effective carrier signal is detected again can be reduced, which allows high-speed as well as stable phase locking to be achieved.

Figure 10:
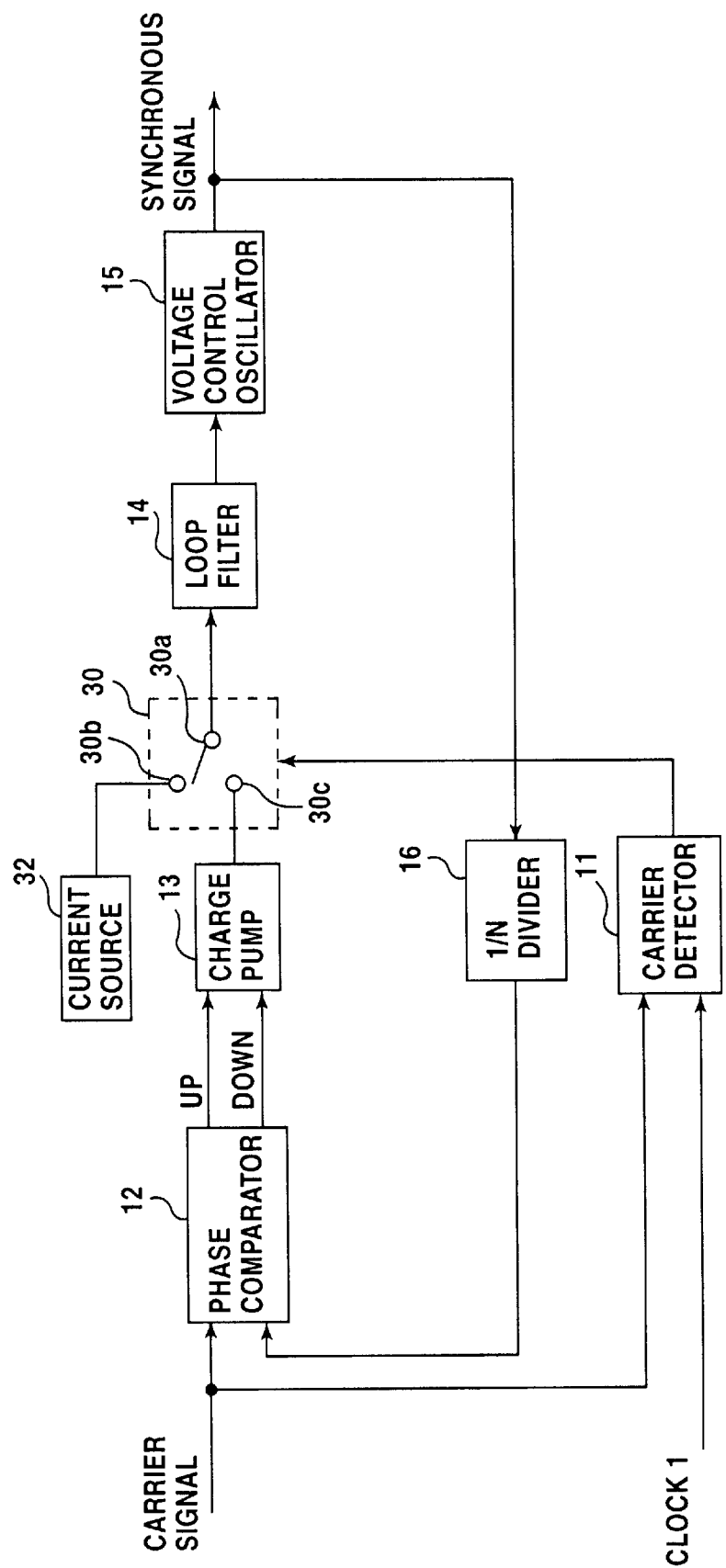
FIG. 10 is a block diagram showing another schematic configuration of the semiconductor integrated circuit according to Embodiment 2.

FIG. 10 is a block diagram showing schematic configuration of an another semiconductor integrated circuit according to Embodiment 2. In the semiconductor integrated circuit shown in FIG. 9, the signal switching circuit 30 is provided in between the loop filter 14 and the voltage control oscillator 15 so that switching is operated between the output from the loop filter 14 and the output from the voltage source 31 and the switched output is inputted into the voltage control oscillator 15, but as the semiconductor integrated circuit shown in FIG. 10, the signal switching circuit 30 may be provided in between the charge pump 13 and the loop filter 14 so that charge to be supplied from the charge pump 13 to the loop filter 14 when a normal carrier signal is inputted may be supplied to the filter by a current source 32.

In the signal switching circuit 30 in this case, the common contact 30a is connected to an input terminal of the loop filter 14, and the switching contact 30c is connected to an output terminal of the charge pump 13. Therefore, the signal switching circuit 30 supplies, when the detection signal indicating a low level is received from the carrier detector 11, a current supplied from the current source 32 to the loop filter 14, and supplies, when the detection signal indicating a high level is received, a current outputted from the charge pump 13 to the loop filter 14, which allows reduction of a lock-up time and high-speed as well as stable phase locking to be achieved like in the semiconductor integrated circuit shown in FIG. 9.

Figure 11:
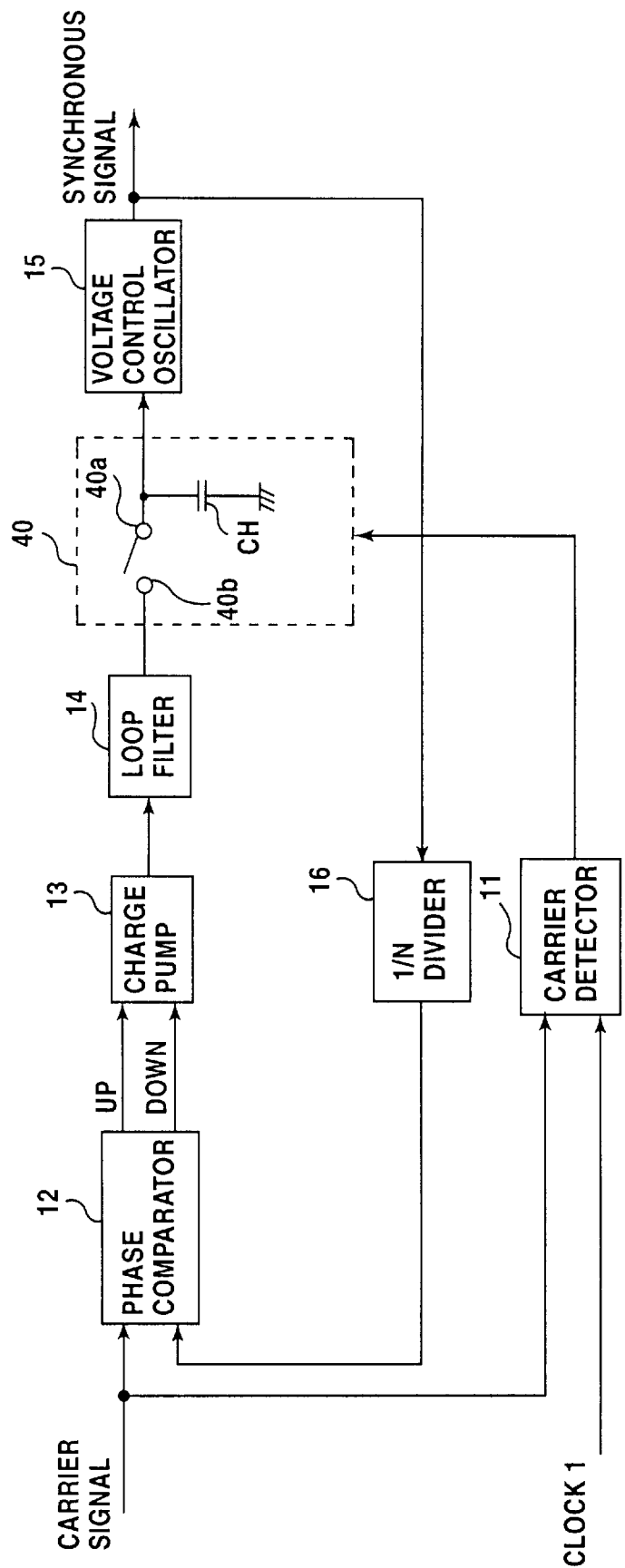
FIG. 11 is a block diagram showing schematic configuration of the semiconductor integrated circuit according to Embodiment 3 of the present invention.

Next, a semiconductor integrated circuit according to Embodiment 3 is described. FIG. 11 is a block diagram showing schematic configuration of the semiconductor integrated circuit according to Embodiment 3. In FIG. 11, the semiconductor integrated circuit according to Embodiment 3 comprises a carrier detector 11, a phase comparator 12, a charge pump 13, a loop filter 14, a voltage control oscillator 15, a 1/N divider 16, and a signal switching circuit 40. It should be noted that the same reference numerals are assigned to the sections common to those in FIG. 2 and description thereof is omitted herein.

In FIG. 11, the signal switching circuit 40 is a circuit comprising a switch for turning ON/OFF the connection between a common contact 40a and a switching contact 40b according to a detection signal outputted from the carrier detector 11 and a capacitor CH. In the signal switching circuit 40, the common contact 40a is connected to a terminal of the voltage control oscillator 15 with a control signal inputted therein, and the switching contact 40b is connected to an output terminal of the loop filter 14.

The capacitor CH is connected in between a signal line linking the common contact 40a to the terminal of the voltage control oscillator 15 with a control signal inputted therein and a ground, and accumulates a voltage to be outputted from the loop filter 14 as a control signal and stores therein the voltage when the common contact 40a and switching contact 40b are connected to each other, namely when the switch is ON.

As for a specific operation of the signal switching circuit 40, when no carrier signal is inputted, or when a carrier signal outside an effective range of a frequency is inputted therein, a low-level detection signal outputted from the carrier detector 11 is inputted into the signal switching circuit 40, due to which the connection between the common contact 40a and the switching contact 30b is disconnected. Namely, the switch is turned OFF, and the voltage held in the capacitor CH is inputted into the voltage control oscillator 15 as a control voltage.

The voltage control oscillator 15 outputs an oscillation signal with a frequency correlated to the control voltage supplied by the capacitor CH as a result of synchronous detection, and also inputs the signal into the 1/N divider 16. In this state, output from the loop filter 14 is not inputted into the voltage control oscillator 15, but an oscillation signal according to the control voltage supplied by the capacitor CH is inputted from the voltage control oscillator 15 into the phase comparator 12 through the 1/N divider 16.

Herein, when an effective carrier signal is inputted again into the phase comparator 12, a high-level detection signal is outputted from the carrier detector 11, and this detection signal is inputted into the signal switching circuit 40, by which the common contact 40a is connected to the switching contact 40b. Namely, the switch is turned ON, and output from the loop filter 14 is inputted into the voltage control oscillator 15 as a control signal.

The oscillation signal according to the voltage supplied by the capacitor CH is inputting from the voltage control oscillator 15 into the phase comparator 12 through the 1/N divider 16 just before the switch in this signal switching circuit 40 is turned ON, therefore, different from the case where a phase of the carrier signal is compared to that of a signal having a frequency sufficiently apart from the frequency of the carrier signal, phase locking can be performed more quickly and a synchronous signal can speedily be obtained.

Further, the output voltage from the loop filter 14 immediately before the ON state of the switch for the signal switching circuit 40 is effected is held in the capacitor CH, and this held output voltage is inputted into the voltage control oscillator 15 as a control voltage, so that the oscillation signal having a frequency closer to a frequency of an effective carrier signal inputted again can be obtained from the voltage control oscillator 15, therefore, even when the frequency of a carrier signal varies, phase locking based on a minimum phase difference can be set as a starting point of the locking operation, which allows further more reduction of a lock-up time to be achieved.

With the Embodiment 3 as described above, when no carrier signal is inputted or when a carrier signal outside an effective range of a frequency is inputted, a detection signal indicating a low level is outputted by the carrier detector 11, and the signal switching circuit 40 stores, when receiving this detection signal indicating a low level, a control voltage to make the voltage control oscillator 15 output a frequency equivalent to a normal carrier signal in the capacitor CH, inputs the stored control voltage in the voltage control oscillator 15, and inputs the output from the loop filter 14 in the voltage control oscillator 15 when the detection signal indicates a high level, therefore, even when no carrier signal is inputted or when a carrier signal outside an effective range of a frequency is inputted therein, an internal oscillation signal can be inputted into the phase comparator 12, hence a lock-up time required when an effective carrier signal is detected again can be reduced, which allows high-speed as well as stable phase locking to be realized.

Figure 12:
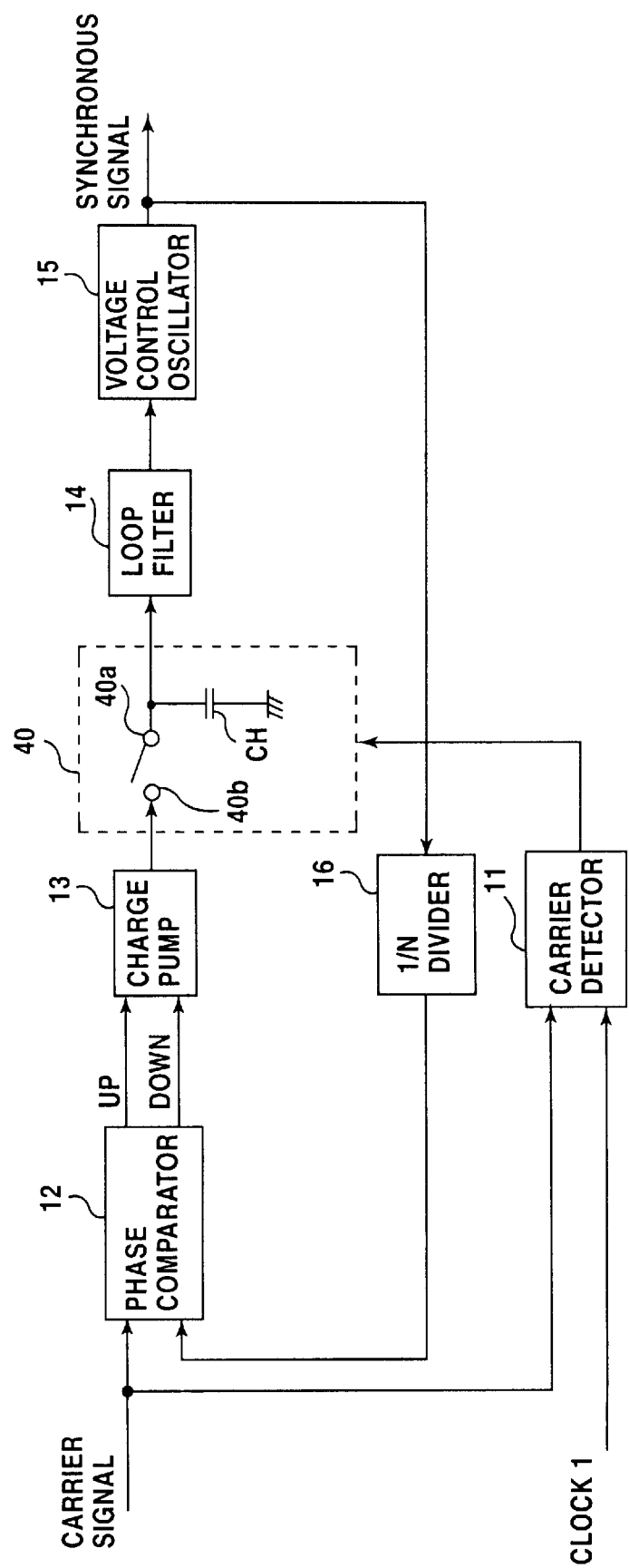
FIG. 12 is a block diagram showing another schematic configuration of the semiconductor integrated circuit according to Embodiment 3.

FIG. 12 is a block diagram showing another schematic configuration of the semiconductor integrated circuit according to Embodiment 3. In the semiconductor integrated circuit shown in FIG. 11, the signal switching circuit 40 is provided in between the loop filter 14 and the voltage control oscillator 15 so that switching is operated between the output from the loop filter 14 and the voltage held in capacitor CH and the switched output is inputted into the voltage control oscillator 15, but as the semiconductor integrated circuit shown in FIG. 12, the signal switching circuit 40 may be provided in between the charge pump 13 and the loop filter 14 so that charge to be supplied from the charge pump 13 to the loop filter 14 when a normal carrier signal is inputted is accumulated and held in the capacitor CH, and this held charge may be supplied to the loop filter 14.

In the signal switching circuit 40 in this case, the common contact 40a is connected to an input terminal of the loop filter 14, and the switching contact 40b is connected to an output terminal of the charge pump 13. Accordingly, the signal switching circuit 40 supplies, when the detection signal indicating a low level is received from the carrier detector 11, a current supplied from the capacitor CH to the loop filter 14, and supplies, when the detection signal indicating a high level is received, a current outputted from the charge pump 13 to the loop filter 14, which allows reduction of a lock-up time and high-speed as well as stable phase locking to be achieved like in the semiconductor integrated circuit shown in FIG. 11.

The semiconductor integrated circuits according to Embodiments 1 to 3 as described above have the signal switching circuits 10, 30, 40, carrier detector 11, phase comparator 12, charge pump 13, loop filter 14, voltage control oscillator 15, and 1/N divider 16 as components, but the voltage control oscillator 15 and/or further the loop filter 14 may be provided as external circuits, and a negative feedback loop may be formed by inputting an oscillation signal outputted from the externally provided voltage control oscillator 15 to be supplied back to this semiconductor integrated circuit.

Especially, in the semiconductor integrated circuit according to the present invention the signal switching circuits 10, 30, 40, carrier detector 11, phase comparator 12, and charge pump 13, or the configuration with the loop filter 14 or the voltage control oscillator 15 added to the above configuration may be integrated into one chip (forming an IC).

Figure 13:
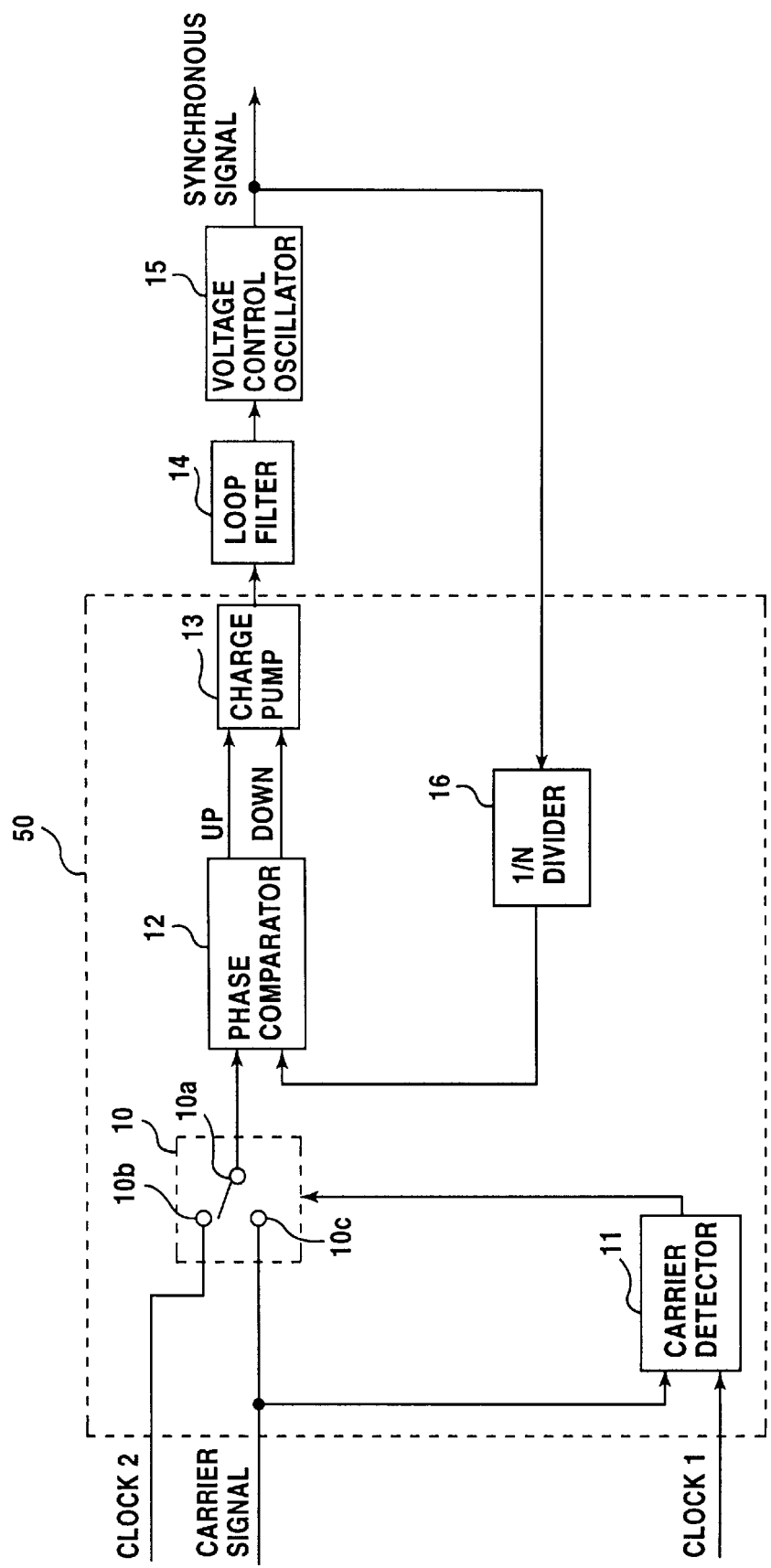
FIG. 13 is a block diagram showing another schematic configuration of the semiconductor integrated circuit according to Embodiment 1.

FIG. 13 is a block diagram showing another schematic configuration of the semiconductor integrated circuit according to Embodiment 1. FIG. 13 shows a state where a semiconductor integrated circuit 50 is obtained by integrating the configuration comprising the signal switching circuit 10, carrier detector 11, phase comparator 12, charge pump 13, and 1/N divider 16 into one chip, and where the loop filter 14 and voltage control oscillator 15 are connected to the semiconductor integrated circuit 50 as external circuits, while the configuration other than that described above is the same as the configuration shown in FIG. 2.

As described above, the design can be changed as required depending on whether the configuration other than the configuration comprising the signal switching circuit 10, carrier detector 11, phase comparator 12, and charge pump 13 such as configuration with the loop filter 14 included in the semiconductor integrated circuit 50 and configuration with the 1/N divider 16 provided as an external circuit is to be included in the semiconductor integrated circuit according to the present invention for integrating into one chip or not.

Figure 14:
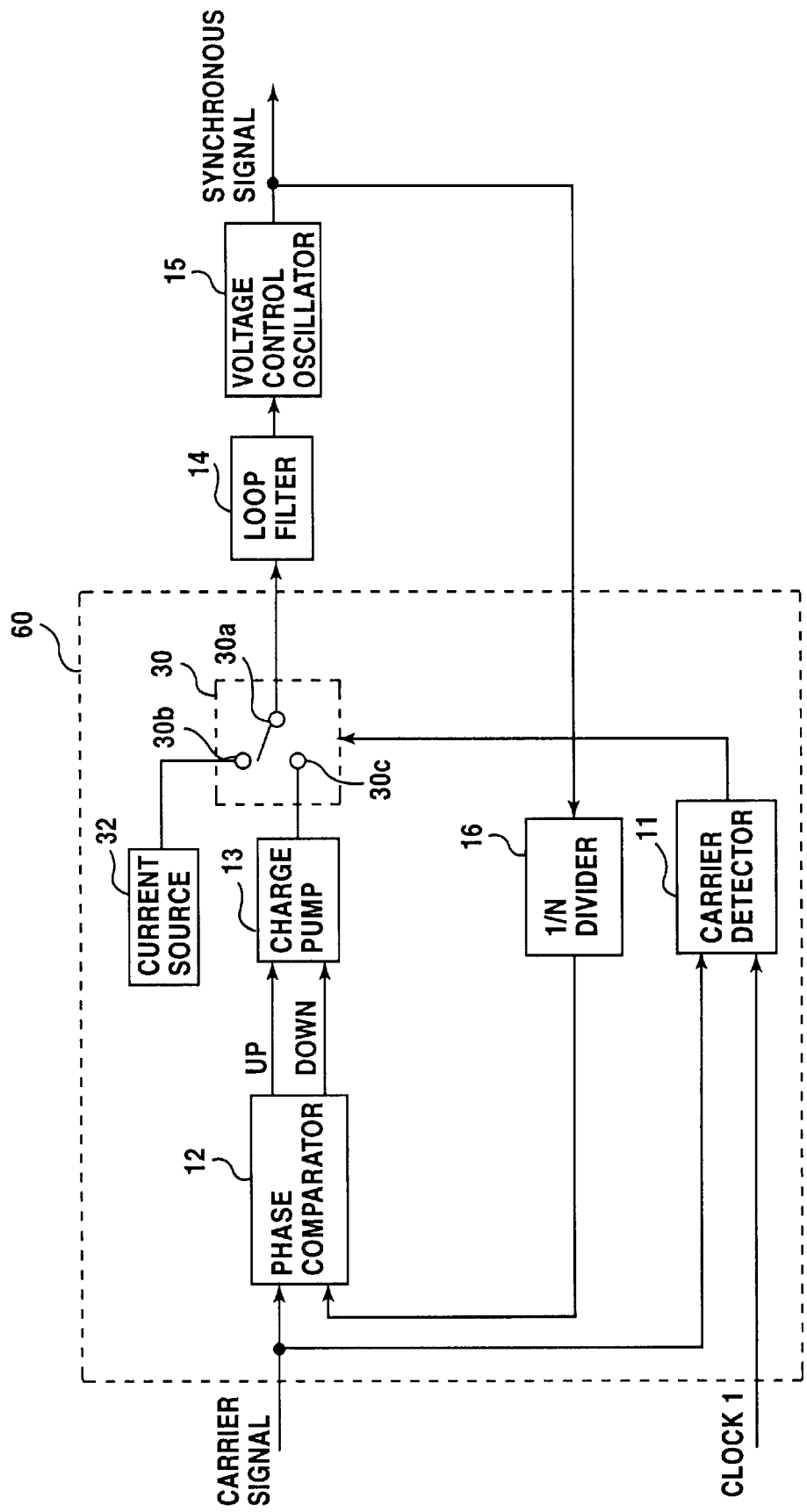
FIG. 14 is a block diagram showing another schematic configuration of the semiconductor integrated circuit according to Embodiment 2.

FIG. 14 is a block diagram showing another schematic configuration of the semiconductor integrated circuit according to Embodiment 2. FIG. 14 shows a state where a semiconductor integrated circuit 60 is obtained by integrating the configuration, especially in FIG. 10, comprising the signal switching circuit 30, carrier detector 11, phase comparator 12, charge pump 13, 1/N divider 16, and voltage source 31 into one chip, and where the loop filter 14 and voltage control oscillator 15 are connected to the semiconductor integrated circuit 60 as external circuits.

As described above, the design can be changed as required depending on whether the configuration other than the configuration comprising the signal switching circuit 30, carrier detector 11, phase comparator 12, charge pump 13, and voltage source 31 such as configuration with the loop filter 14 included in the semiconductor integrated circuit 60 and configuration with the 1/N divider 16 provided as an external circuit is to be included in the semiconductor integrated circuit according to the present invention for integrating into one chip or not.

Figure 15:
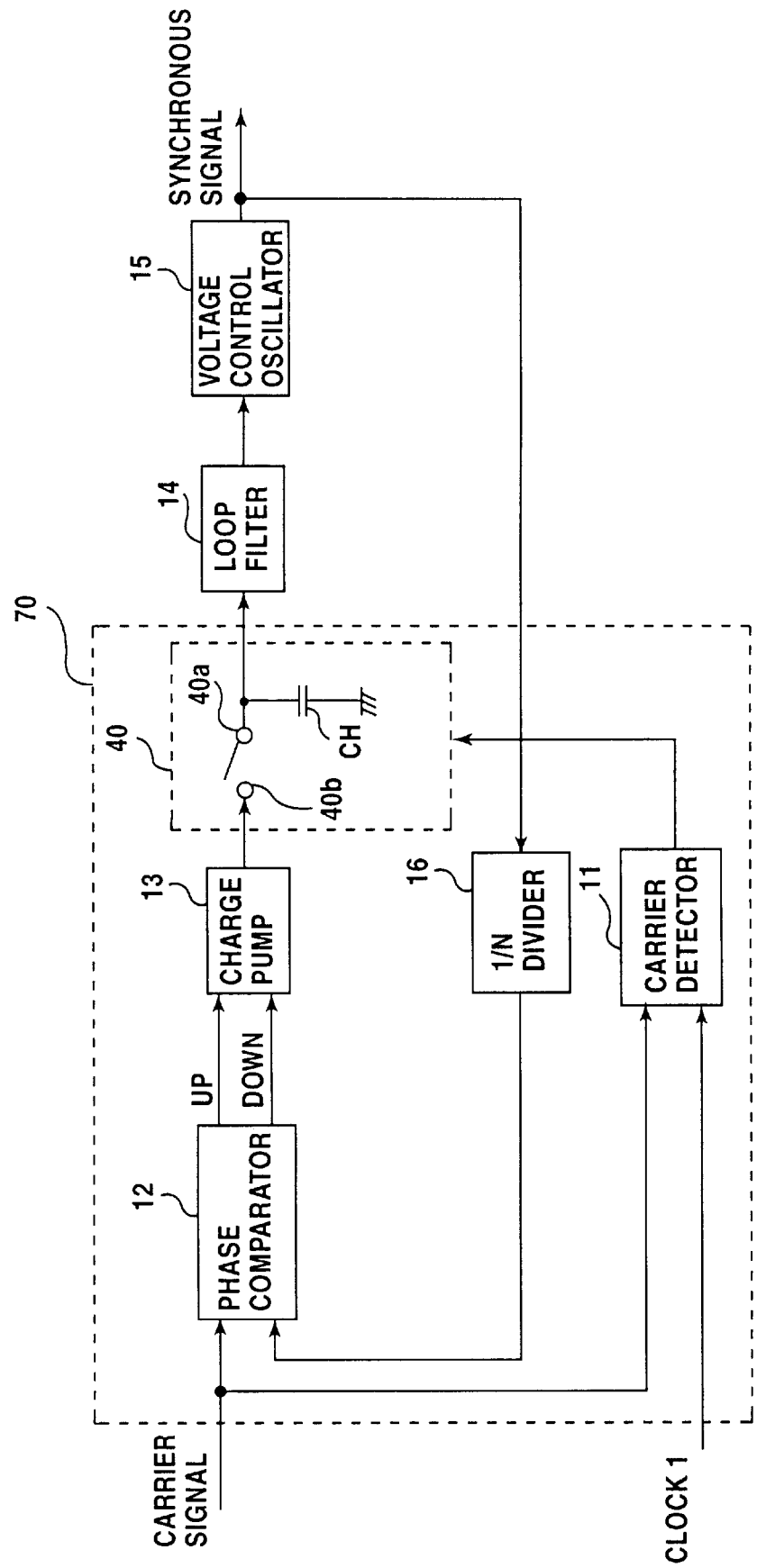
FIG. 15 is a block diagram showing another schematic configuration of the semiconductor integrated circuit according to Embodiment 3.

FIG. 15 is a block diagram showing another schematic configuration of the semiconductor integrated circuit according to Embodiment 3. FIG. 15 shows a state where a semiconductor integrated circuit 70 is obtained by integrating the configuration comprising the signal switching circuit 40, carrier detector 11, phase comparator 12, charge pump 13, and 1/N divider 16 into one chip, and where the loop filter 14 and voltage control oscillator 15 are connected to the semiconductor integrated circuit 70 as external circuits, and the configuration other than that described above is the same as the configuration shown in FIG. 12.

As described above, the design can be changed as required depending on whether the configuration other than the configuration comprising the signal switching circuit 40, carrier detector 11, phase comparator 12, and charge pump 13 such as configuration with the loop filter 14 included in the semiconductor integrated circuit 70 and configuration with the 1/N divider 16 provided as an external circuit is to be included in the semiconductor integrated circuit according to the present invention for integrating into one chip or not.

The semiconductor integrated circuit according to any of Embodiments 1 to 3 can function as a PLL circuit applied in radio equipment such as a portable telephone, an automobile telephone, and a cordless telephone; tuning to a frequency, a detector, data reproduction, and clock reproduction in a modem for wire or wireless modem; or a frequency synthesizer and a motor speed controller or the like, and the phase comparator 12 can be selected as a mixer type of phase comparator, a digital system of phase comparator, or a phase frequency comparator for designing as required; the loop filter 14 as an active loop filter; and the voltage control oscillator 15 as an emitter-linked multi-vibrator, a voltage control oscillator with configuration of CMOS, or a voltage control oscillator using an operation amplifier each according to any of those object devices.

As described above, with the present invention, even when a specified signal is not detected or when an input signal outside a specified range of a frequency is inputted, a signal for maintaining oscillation and output of a synchronous signal (internal oscillation signal) is replaced and can be inputted into a voltage control oscillator, and when an effective signal is inputted again, a high-speed locking operation can be preformed and a synchronous signal can speedily be obtained as compared to the case where a feedback loop operation is started from the state in which an internal oscillation signal is not outputted from the voltage control oscillator, namely from the state in which there is no feedback signal therein.

This application is based on Japanese patent application No. HEI 10-345970 filed in the Japanese Patent Office on Dec. 4, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:
    a voltage controlled oscillator which outputs a synchronous signal based on a specified signal;
    a phase comparator which receives the synchronous signal output by said voltage controlled oscillator as a feedback signal and a carrier signal, compares the phases of the received feedback signal and the carrier signal, and outputs a comparison signal that indicates a result of the phase comparison to said voltage controlled oscillator;
    a carrier detector which receives said carrier signal and a reference clock, compares the carrier signal and the reference clock, and generates an oscillation state detection signal which indicates whether the frequency of the carrier signal is within a predetermined range; and
    a signal switch which:
        a) receives the comparison signal and a signal capable of maintaining the oscillating state of said voltage controlled oscillator, and the oscillation state detection signal; and
        b) when the oscillation state detection signal indicates that the frequency of the carrier signal is within the predetermined range, the comparison signal is output by said signal switch; and
        c) when the oscillation state detection signal indicates that the frequency of the carrier signal is not within the predetermined range, the signal capable of maintaining the oscillating state of said voltage controlled oscillator is output by said signal switch;
    wherein the signal output by said signal switch is applied to said voltage controlled oscillator as the specified signal.

2. A semiconductor integrated circuit according to the claim 1, wherein said carrier detector comprises:
    a pulse counter which receives the carrier signal and the reference clock, counts a number of pulses of the carrier signal during a specified period of time based on the reference clock; and
    a pulse comparing unit which determines whether the number of pulses counted by said pulse counter are within the predetermined range of the frequency of the carrier signal, generates and outputs the oscillation state detection signal which indicates that the frequency of the carrier signal is within the predetermined range when the number of pulses is within the predetermined range of frequency of the carrier signal, and generates and outputs the oscillation state detection signal which indicates that the frequency of the carrier signal is not within the predetermined range when the number of pulses is not within the predetermined range of frequency of the carrier signal.

3. A semiconductor integrated circuit according to the claim 1, wherein said carrier detector comprises:
    a clock counter which receives the carrier signal and the reference clock, counts a number of clocks of the reference clock during a specified period of time based on the carrier signal; and
    a clock comparing unit which determines whether the number of clocks counted by said clock counter is within the predetermined range of the frequency of the carrier signal, generates and outputs the oscillation state detection signal which indicates that the frequency of the carrier signal is within the predetermined range when the number of clocks is within the predetermined range of frequency of the carrier signal, and generates and outputs the oscillation state detection signal which indicates that the frequency of the carrier signal is not within the predetermined range when the number of clocks is not within the predetermined range of frequency of the carrier signal.

4. A semiconductor integrated circuit comprising:
    a voltage controlled oscillator which outputs a synchronous signal based on a comparison signal;
    a phase comparator which receives the synchronous signal output by said voltage controlled oscillator as a feedback signal and a specified signal, compares the phases of the received feedback signal and the specified signal, and outputs a comparison signal that indicates a result of the phase comparison to said voltage controlled oscillator;
    a carrier detector which receives a carrier signal and a first reference clock, compares the carrier signal and the first reference clock, and generates an oscillation state detection signal which indicates whether the frequency of the carrier signal is within a predetermined range; and
    a signal switch which:
        a) receives the carrier signal, a second reference clock having a frequency that is constant and substantially equal to the frequency of the carrier signal, and the oscillation state detection signal; and
        b) outputs the carrier signal to said phase comparator as the specified signal when the oscillation state detection signal indicates that the frequency of the carrier signal is within the predetermined range, and outputs the second reference clock to said phase comparator as the specified signal when the oscillation state detection signal indicates that the frequency of the carrier signal is not within the predetermined range.

5. A semiconductor integrated circuit according to the claim 4, wherein said carrier detector comprises:
   a pulse counter which receives the carrier signal and the first reference clock, counts a number of pulses of the carrier signal during a specified period of time based on the first reference clock; and
   a pulse comparing unit which determines whether the number of pulses counted by said pulse counter are within the predetermined range of the frequency of the carrier signal, generates and outputs the oscillation state detection signal which indicates that the frequency of the carrier signal is within the predetermined range when the number of pulses is within the predetermined range of frequency of the carrier signal, and generates and outputs the oscillation state detection signal which indicates that the frequency of the carrier signal is not within the predetermined range when the number of pulses is not within the predetermined range of frequency of the carrier signal.

6. A semiconductor integrated circuit according to the claim 4, wherein said carrier detector comprises:
   a clock counter which receives the carrier signal and the first reference clock, counts a number of clocks of the first reference clock during a specified period of time based on the carrier signal; and
   a clock comparing unit which determines whether the number of clocks counted by said clock counter is within the predetermined range of the frequency of the carrier signal, generates and outputs the oscillation state detection signal which indicates that the frequency of the carrier signal is within the predetermined range when the number of clocks is within the predetermined range of frequency of the carrier signal, and generates and outputs the oscillation state detection signal which indicates that the frequency of the carrier signal is not within the predetermined range when the number of clocks is not within the predetermined range of frequency of the carrier signal.

7. A semiconductor integrated circuit comprising:
   a voltage controlled oscillator which outputs a synchronous signal based on a comparison signal;
   a phase comparator which receives the synchronous signal output by said voltage controlled oscillator as a feedback signal and a carrier signal, compares the phases of the received feedback signal and the carrier signal, and outputs a comparison signal that indicates a result of the phase comparison to said voltage controlled oscillator;
   a carrier detector which receives the carrier signal and a first reference clock, compares the carrier signal and the first reference clock, and generates an oscillation state detection signal which indicates whether the frequency of the carrier signal is within a predetermined range;
   one of a constant voltage source and a constant current source, that generates a signal having a constant voltage or a constant current, respectively; and
   a signal switch which:
   a) receives the comparison signal, the signal output from said one of said constant voltage source and said constant current source, and the oscillation state detection signal; and
   b) when the oscillation state detection signal indicates that the frequency of the carrier signal is within the predetermined range, the comparison signal is output by said signal switch to said voltage controlled oscillator; and
   c) when the oscillation state detection signal indicates that the frequency of the carrier signal is not within the predetermined range, the signal output from said one of said constant voltage source and said constant current source is output by said signal switch to said voltage controlled oscillator.

8. A semiconductor integrated circuit according to the claim 7, wherein said carrier detector comprises:
   a pulse counter which receives the carrier signal and the first reference clock, counts a number of pulses of the carrier signal during a specified period of time based on the first reference clock; and
   a pulse comparing unit which determines whether the number of pulses counted by said pulse counter are within the predetermined range of the frequency of the carrier signal, generates and outputs the oscillation state detection signal which indicates that the frequency of the carrier signal is within the predetermined range when the number of pulses is within the predetermined range of frequency of the carrier signal, and generates and outputs the oscillation state detection signal which indicates that the frequency of the carrier signal is not within the predetermined range when the number of pulses is not within the predetermined range of frequency of the carrier signal.

9. A semiconductor integrated circuit according to the claim 7, wherein said carrier detector comprises:
   a clock counter which receives the carrier signal and the first reference clock, counts a number of clocks of the first reference clock during a specified period of time based on the carrier signal; and
   a clock comparing unit which determines whether the number of clocks counted by said clock counter is within the predetermined range of the frequency of the carrier signal, generates and outputs the oscillation state detection signal which indicates that the frequency of the carrier signal is within the predetermined range when the number of clocks is within the predetermined range of frequency of the carrier signal, and generates and outputs the oscillation state detection signal which indicates that the frequency of the carrier signal is not within the predetermined range when the number of clocks is not within the predetermined range of frequency of the carrier signal.

10. A semiconductor integrated circuit comprising:
    a voltage controlled oscillator which outputs a synchronous signal based on a comparison signal;
    a phase comparator which receives the synchronous signal output by said voltage controlled oscillator as a feedback signal and a carrier signal, compares the phases of the received feedback signal and the carrier signal, and outputs a comparison signal that indicates a result of the phase comparison to said voltage controlled oscillator;
    a signal holding unit which holds a normal comparison signal;
    a carrier detector which receives the carrier signal and a first reference clock, compares the carrier signal and the first reference clock, and generates an oscillation state detection signal which indicates whether the frequency of the carrier signal is within a predetermined range; and a signal switch which:
  a) receives the comparison signal, the normal comparison signal, and the oscillation state detection signal; and
  b) when the oscillation state detection signal indicates that the frequency of the carrier signal is within the predetermined range, the comparison signal is output by said signal switch to said voltage controlled oscillator; and
  c) when the oscillation state detection signal indicates that the frequency of the carrier signal is not within the predetermined range, said normal comparison signal is output by said signal switch to said voltage controlled oscillator.

11. A semiconductor integrated circuit according to the claim 10, wherein said carrier detector comprises:
  a pulse counter which receives the carrier signal and the first reference clock, counts a number of pulses of the carrier signal during a specified period of time based on the first reference clock; and
  a pulse comparing unit which determines whether the number of pulses counted by said pulse counter are within the predetermined range of the frequency of the carrier signal, generates and outputs the oscillation state detection signal which indicates that the frequency of the carrier signal is within the predetermined range when the number of pulses is within the predetermined range of frequency of the carrier signal, and generates and outputs the oscillation state detection signal which indicates that the frequency of the carrier signal is not within the predetermined range when the number of pulses is not within the predetermined range of frequency of the carrier signal.

12. A semiconductor integrated circuit according to the claim 10, wherein said carrier detector comprises:
  a clock counter which receives the carrier signal and the first reference clock, counts a number of clocks of the first reference clock during a specified period of time based on the carrier signal; and
  a clock comparing unit which determines whether the number of clocks counted by said clock counter is within the predetermined range of the frequency of the carrier signal, generates and outputs the oscillation state detection signal which indicates that the frequency of the carrier signal is within the predetermined range when the number of clocks is within the predetermined range of frequency of the carrier signal, and generates and outputs the oscillation state detection signal which indicates that the frequency of the carrier signal is not within the predetermined range when the number of clocks is not within the predetermined range of frequency of the carrier signal.

13. A semiconductor integrated circuit according to the claim 10, wherein said signal holding unit comprises a capacitor.

* * * * *